(12) United States Patent
Hamamoto

(10) Patent No.: US 6,521,938 B2
(45) Date of Patent: *Feb. 18, 2003

(54) DYNAMIC-TYPE SEMICONDUCTOR MEMORY DEVICE

(75) Inventor: Takeshi Hamamoto, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,383

(22) Filed: Dec. 2, 1998

(65) Prior Publication Data

US 2001/0050388 A1 Dec. 13, 2001

(30) Foreign Application Priority Data

Dec. 4, 1997 (JP) .............................. 9-333806

(51) Int. Cl.$^7$ .............................. H01L 27/108
(52) U.S. Cl. ............... 257/304; 257/301; 257/303; 257/305
(58) Field of Search ............... 257/301, 303, 257/304, 305

(56) References Cited

U.S. PATENT DOCUMENTS

| | | | | |
|---|---|---|---|---|
| 4,918,500 A | * | 4/1990 | Inuishi | 357/23.6 |
| 4,922,313 A | * | 5/1990 | Tsuchiya | 357/23.6 |
| 5,097,381 A | * | 3/1992 | Vo | 361/313 |
| 5,508,541 A | * | 4/1996 | Hieda et al. | 257/301 |
| 5,521,407 A | * | 5/1996 | Kohyama et al. | 257/301 |
| 5,555,520 A | * | 9/1996 | Sudo et al. | 365/149 |
| 5,729,054 A | * | 3/1998 | Summerfelt et al. | 257/751 |
| 6,043,528 A | * | 3/2000 | Aoki et al. | 257/301 |

FOREIGN PATENT DOCUMENTS

| | | |
|---|---|---|
| JP | 9-36319 | 2/1997 |
| JP | 9-139480 | 5/1997 |
| JP | 9-232534 | 9/1997 |

* cited by examiner

Primary Examiner—Eddie Lee
Assistant Examiner—N. Drew Richards
(74) Attorney, Agent, or Firm—Banner & Witcoff, Ltd.

(57) ABSTRACT

MOS transistors are formed on island-shaped divided element regions of a silicon substrate, and provided with gate electrodes having the same widths as the element regions. Thereafter, capacitor grooves are formed at end portions of the element regions, and capacitor insulating films formed of BSTO are provided on inner walls of the capacitor grooves. Then, the capacitor grooves are filled with storage electrodes, thereby forming capacitors. Furthermore, connection conductors are formed to connect the storage electrodes and source diffusion layers of the MOS transistors. Then, word lines are formed to connect the gate electrodes of the MOS transistors, and further bit lines are formed to connect drain diffusion layers of the MOS transistors.

16 Claims, 16 Drawing Sheets

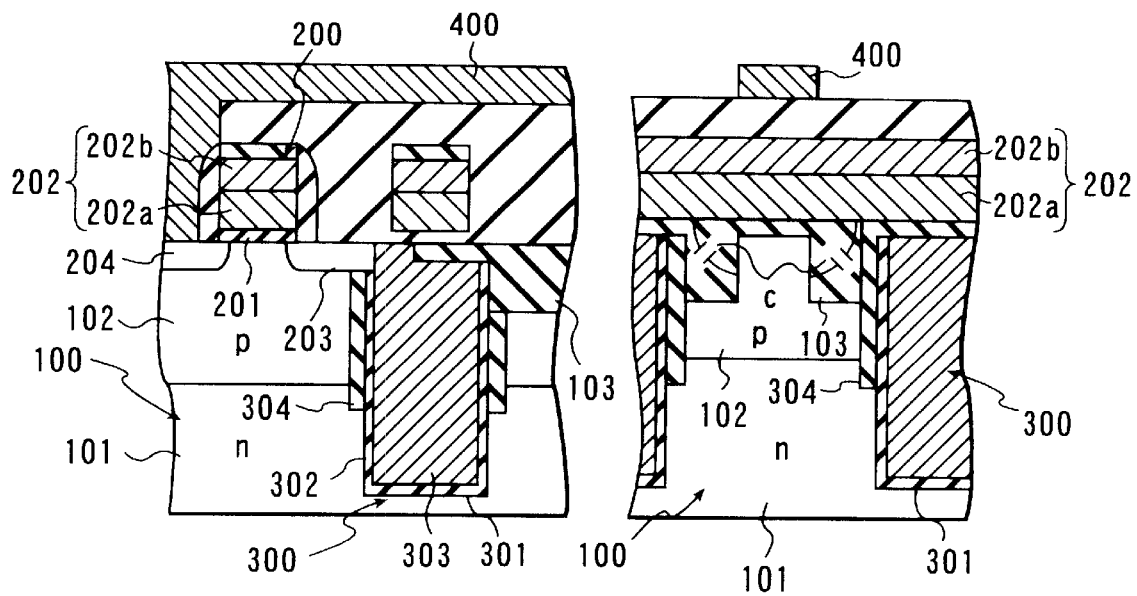
FIG. 1 (PRIOR ART)    FIG. 2 (PRIOR ART)
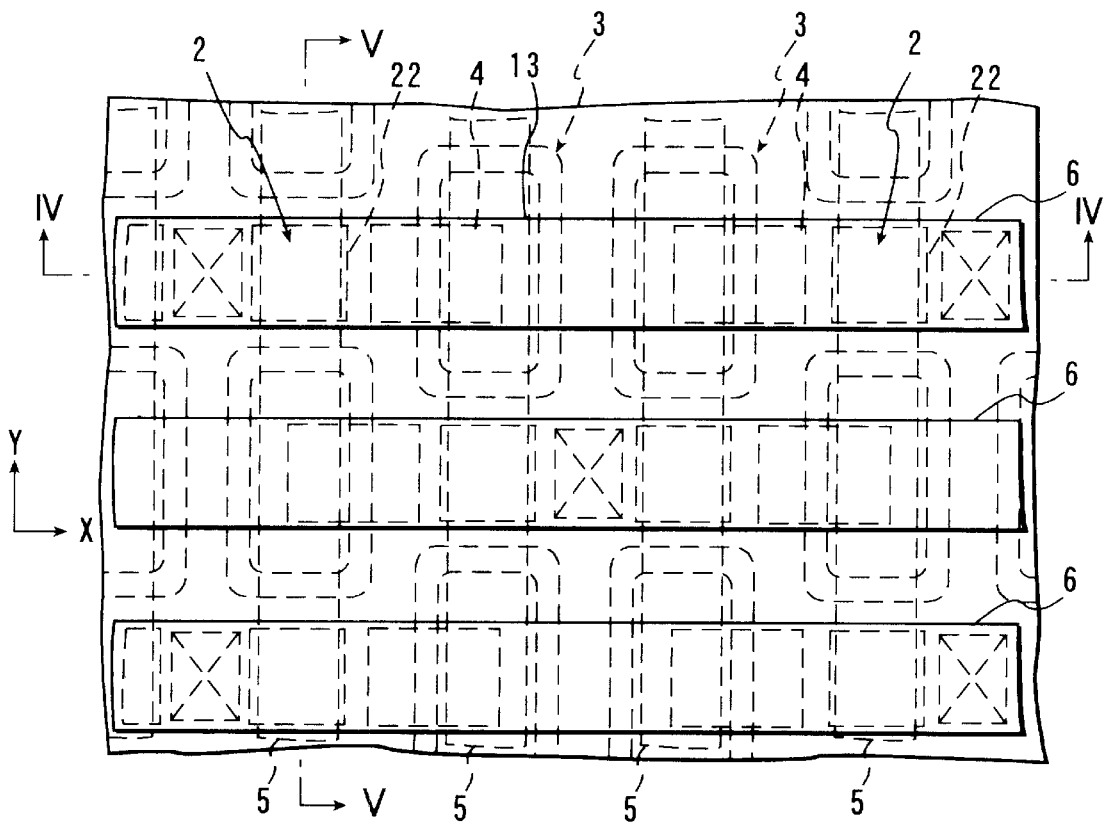
FIG. 3

DYNAMIC-TYPE SEMICONDUCTOR MEMORY DEVICE

BACKGROUND OF THE INVENTION

The present invention relates to a dynamic type semiconductor memory device (DRAM) having memory cells each having a trench capacitor structure.

In general, a DRAM includes memory cells each of which comprises one MOS transistor and one capacitor. A trench capacitor structure is well known as the structure of such a memory cell.

FIG. 1 is a cross-sectional view of a memory cell having a conventional substrate-plate type trench structure, the view being taken along a line extending in a direction in which bit lines extend.

The memory cell shown in FIG. 1 comprises a MOS transistor 200 and a capacitor 300. A semiconductor substrate 100 has an n-type well 101, on which a p-type well 102 is formed. The p-type well 102 is divided into island-shaped element regions by insulating films 103. The MOS transistor 200 comprises a gate electrode 202 and n$^+$-type source and drain diffusion layers 203 and 204. The gate electrode 202 is formed on the p-type well 102, with a gate insulating film 201 interposed between the gate electrode 202 and the p-type well 102. The n$^+$-type source and drain diffusion layers 203 and 204 are self-aligned with the gate electrode 202. The gate electrode 202 is formed of a laminated film consisting of, e.g., a polysilicon film 202$a$ and a Wsi film 202$b$. A plurality of gate electrodes having such a structure are arranged in rows, and thus included in word lines thereof.

The capacitor 300 is provided in a groove 301. A capacitor insulating film 302 is formed on the inner wall of the groove 301, and further a storage electrode 303 is filled in the inner remaining region of the groove 301. The n-type well 101 is used as a plate electrode of the capacitor. An insulting film 304 is formed on the outer wall of an upper portion of the groove 301.

The storage electrode 303 filled in the groove 301 is connected to the source diffusion layer 203 of the MOS transistor 200 which is diffusely formed to be partially stacked on the storage electrode 303. A bit line 400 is connected to the drain diffusion layer 204, and extends to in a direction perpendicular to the word line.

In the above memory cell structure, each of the word lines has portions functioning as gate electrodes and portions not functioning as gate electrodes. The latter portions are located above capacitor regions of memory cells arranged adjacent to each other in a direction in which said each word line extends.

In such a manner, in the memory cell having the conventional trench capacitor structure, the storage electrode 303 is filled in the capacitor groove 301, thus increasing the total area of the outer peripheral surfaces of the capacitor 300 which is provided, with the capacitor insulating film 302 interposed between the storage electrode 303 and the n-type well 101. By virtue of this structure, memory cells can be formed smaller and a DRAM can be formed at a higher integration density.

Furthermore, in the conventional memory cell, the area of the opening of the capacitor groove is reduced as the memory cell area is reduced. Hence, the depth of the capacitor groove needs to be increased to secure a sufficient capacitance.

In general, it is difficult to form a groove having a great aspect ratio. In order to restrict the increase in the aspect ratio, and secure a sufficient capacitance, it is considered to use an insulating film having a high dielectric constant, e.g., a high dielectric constant material film as a capacitor insulating film. However, in the conventional memory cell structure, the high dielectric constant material film can hardly be used as the capacitor insulating film since the source and drain diffusion layers of a MOS transistor are formed after a capacitor is formed to be filled in the substrate. To be more specific, in general, when a high dielectric constant material film is subjected to a heating step using heat of approximately 800° C., it changes in composition, etc. and its dielectric constant lowers, increasing leakage current. Therefore, if it is used as the capacitor insulating film in the conventional memory structure, when the source and drain diffusion layers are subjected to a heating step, as impurity activation, the function of the capacitor lowers.

In addition, there is a possibility that the composition of the film may change such that for example, oxygen removes from the high dielectric constant material film, or the high dielectric constant material film may react with the semiconductor substrate or the storage electrode. Furthermore, in the conventional trench capacitor structure, the gate electrodes 202 of the MOS transistors are arranged in rows, and included in the word lines. They, as shown in FIG. 2 (cross-sectional view), extend from positions above element regions to positions above the outsides thereof, and thus floating capacitors (represented by C in FIG. 2) generate between the gate electrodes and bulk regions of the MOS transistors. The floating capacitor causes a signal delay at the word line, as a result of which the memory cell cannot operate at a high speed.

BRIEF SUMMARY OF THE INVENTION

In view of the foregoing, the object of the present invention is to provide a dynamic type semiconductor memory device and a manufacturing method for the same, wherein gate electrodes are provided only above element regions, thus achieving a trench capacitance structure wherein the floating capacitance is smaller and each memory cell can operate a higher speed.

According to the present invention, a dynamic type semiconductor memory device is provided, which comprises:

a semiconductor substrate;

element regions formed on the semiconductor substrate such that the element regions are island-shaped and isolated from each other;

MOS transistors including gate electrodes and source and drain diffusion layers, and arranged in rows in a first direction and also arranged in rows in a second direction perpendicular to the first direction, the gate electrodes being located above the element regions, the source and drain diffusion layers self-aligned with the gate electrodes;

capacitor grooves formed in the semiconductor substrate and located at end portions of the element regions;

capacitors including capacitor insulating films and storage electrodes, the capacitor insulating film being constituted by high dielectric constant materials formed on inner walls of the capacitor grooves, the storage electrodes being formed within the capacitor grooves;

connection conductors each connecting the storage electrode of a respective one of the capacitors and one of the source and drain diffusion layers of a respective one of the MOS transistors;

word lines arranged such that each of the word lines connect the gate electrodes of those of MOS transistors which are arranged in an associated one of the rows in the first direction; and bit lines arranged such that each of the bit lines connects the others of the source and drain diffusion layers of those of the MOS transistors which are arranged in an associated one of the rows in the second direction.

In the dynamic type semiconductor memory device, it is preferable that the word lines be formed of conductive films constituting layers differing from layers constituted by the gate electrodes.

In the dynamic type semiconductor memory device, it is preferable that the word lines be formed of conductive films constituting layers located above layers constituted by the gate electrodes.

In the dynamic type semiconductor memory device, it is preferable that the gate electrodes of the MOS transistors have substantially the same widths as the element regions.

In the dynamic type semiconductor memory device, it is preferable that:

the capacitors further include plate electrodes formed on the inner walls of the capacitor grooves and containing strontium ruthenium oxides;

the capacitor insulating films be formed of barium strontium titanium oxide, and provided on surfaces of the plate electrodes; and the storage electrodes be formed of strontium ruthenium oxides, and provided on the capacitor insulating films, filling the capacitor grooves.

In the dynamic type semiconductor memory device, it is preferable that the each bit line have a connection portion which connects the others of the source and drain diffusion layers which are arranged in the associated one of the rows in the second direction, and which is self-aligned between associated adjacent two of the word lines, with two insulating films interposed between the contact portion of the each bit line and each of the associated two of the word lines.

In the dynamic type semiconductor memory device, it is preferable that the word lines extend over the capacitors, and the each of the connection conductors is connected to the respective one of the storage electrodes under an associated one of the word lines.

Furthermore, according to the present invention, a method for manufacturing a dynamic type semiconductor memory device is provided, and comprises:

a step of forming gate electrode material films on a semiconductor substrate, with gate insulating films interposed between the gate electrode material films and the semiconductor substrate;

a step of performing etching such that the gate electrode material films and the gate insulating films remain in element regions island-shaped and isolated from each other, and then etching peripheral portions of the element regions in the semiconductor substrate to a predetermined depth, thereby forming element isolation grooves;

a step of filling element isolation insulating films in the element isolation grooves;

a step of forming MOS transistors such that the MOS transistors are arranged in rows in first and second directions perpendicular to each other, by patterning the gate electrode material films remaining in the element regions, thereby forming gate electrodes which have the same widths as the element regions, and by doping impurities by using the gate electrodes by a mask, thereby source and drain diffusion layers;

a step of forming side wall-insulating films on side walls of the gate electrodes;

a step of forming a mask insulating film having openings above end portions of the element regions;

a step of forming capacitor grooves by etching the semiconductor substrate through the openings of the mask insulating film;

a step of forming capacitors by filling storage electrodes in the capacitor grooves after forming capacitor insulating films on inner walls of the capacitor grooves;

a step of forming connection conductors each connecting the storage electrode of a respective one of the capacitors and one of the source and drain diffusion layers of a respective one of the MOS transistors;

a step of forming word lines such that each of the word lines connect the gate electrodes of those of MOS transistors which are arranged in an associated one of the rows in the first direction; and a step of forming bit lines such that each of the bit lines connects the others of the source and drain diffusion layers of those of the MOS transistors which are arranged in an associated one of the rows in the second direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments ments given below, serve to explain the principles of the invention.

FIG. 1 is a cross-sectional view of a memory cell array of a conventional DRAM having a trench capacitor structure.

FIG. 2 is a cross-sectional view of the memory cell array of the conventional DRAM.

FIG. 3 is a plan view of memory cells of a DRAM according to the first embodiment of the present invention.

DETAILED DESCRIPTION OF THE INVENTION

Figure 4:
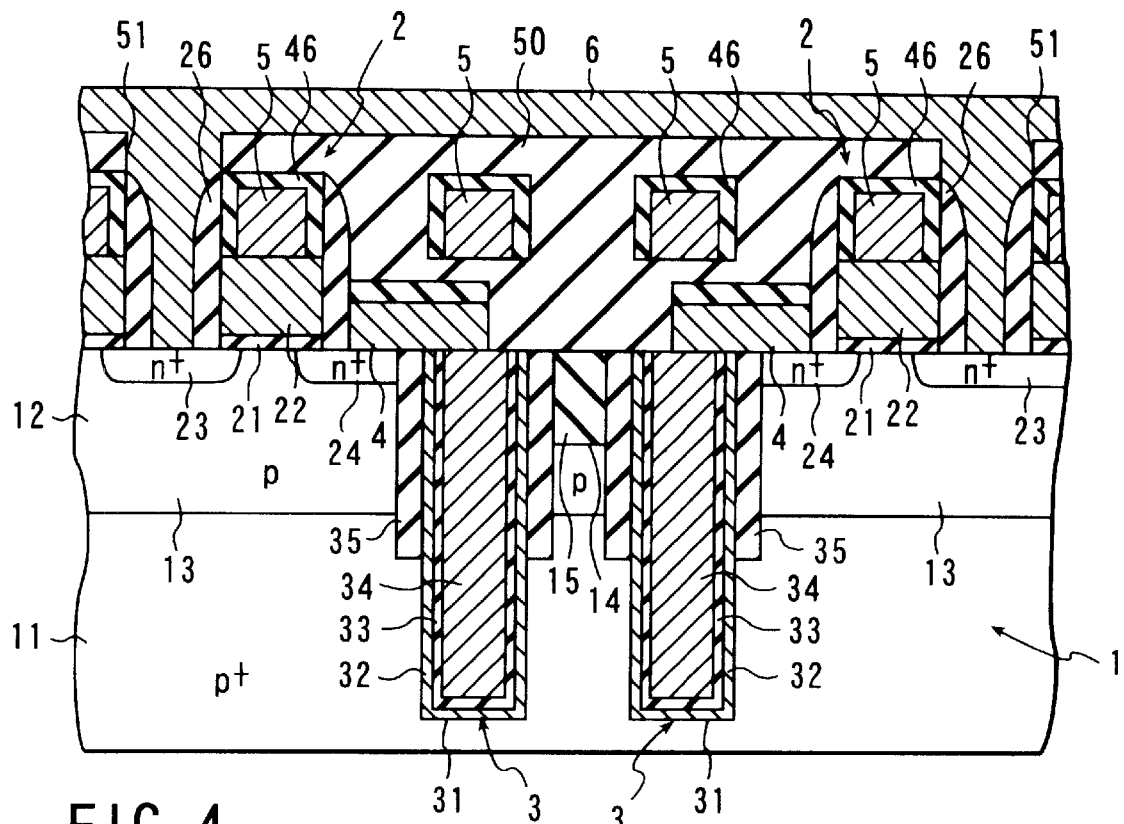
FIG. 4 is a cross-sectional view taken along line IV—IV in FIG. 3.
Figure 5:
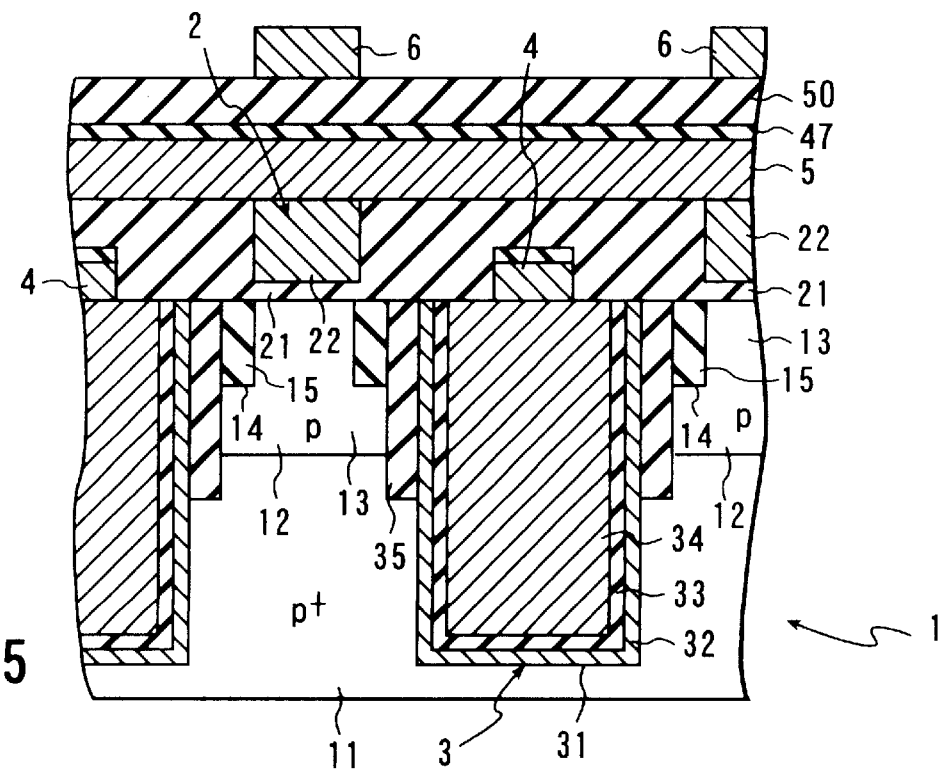
FIG. 5 is a cross-sectional view taken along line V—V in FIG. 3.

FIG. 3 is a plan view for showing a memory cell array of a DRAM according to the first embodiment of the present invention. FIG. 4 is a cross-sectional view taken along line IV—IV in FIG. 4. FIG. 5 is a cross-sectional view taken along line V—V in FIG. 3.

In the first embodiment, a substrate 1 includes a $P^+$-type silicon substrate 11 as a starting substrate. Epitaxial layers are formed on a surface of the $P^+$-type silicon substrate 11, and an p-type well 12 is formed in memory array regions of the epitaxial layers. The p-type well 12 is divided into island-shaped element regions 13 by element isolation grooves 14 and element isolation insulating films 15 filled therein. Each of the element regions 13 is processed to be elongated as viewed from above. MOS transistors 2 are formed above the elements regions 13, and capacitors 3 are provided in capacitor grooves 31 formed at end portions of the element regions 13.

The MOS transistors 2 comprise gate electrodes 22 and drain and source diffusion layers 23 and 24. The gate electrodes 22 are formed on surfaces of the p-type well 12 in the element regions 13, with gate insulating films 21 interposed between the gate electrodes 22 and the p-type well 12. The drain and source diffusion layers 23 and 24 are self-aligned with each other. The widths of the gate electrodes 22, as explained later by referring to a manufacturing step, are determined at the same time as the element regions 13 are processed. To be more specific, as shown in FIG. 5, the gate electrodes 22 have the same widths as the element regions 13, and needless to say, provided as the same intervals as the MOS transistors 2 since they are included therein. In the first embodiment, as mentioned above, the widths of the gate electrodes 22 are the same as those of the element regions 13; however, the widths are not necessarily exactly the same, but they may be only substantially so.

The capacitors 3, as explained below, are formed after formation of the MOS transistors 2, and comprise plate electrodes 32 formed on inner walls of the capacitor grooves 31, capacitor insulating films 33 formed on the plate electrodes 32, and storage electrodes 34 filled in the remaining inner regions of the capacitors 3. In the first embodiment, the capacitor insulating films 33 are barium strontium titanium oxide (BSTO) films, which are dielectric, and the storage electrodes 34 are strontium ruthenium oxide (SRO) films. The plate electrodes 32 are formed of conductive films containing at least SRO. In the first embodiment, they are formed of a laminated film containing titanium silicide ($TiSi_2$), titanium nitride (TiN) and SRO.

The storage electrodes 34 of the capacitors 3 are connected to the source diffusion layers 24 of the MOS transistors 2 by connection conductors 4, respectively. The gate electrodes 22 of the MOS transistors 2 above the element regions 13 are arranged in rows in a Y direction indicated in FIG. 3, and connected to each other by word lines 5 extending in the Y direction, respectively. The drain diffusion layers 23 of the MOS transistors 2 are connected to bit lines 6, respectively, which extend in an X direction indicated in FIG. 3, and which cross over the word lines 5 such that the bits lines 6 are located above the word lines 5.

As shown in FIG. 4, side wall-insulating films 26 are formed of silicon nitride films, and provided on side walls of the gate electrodes 22, respectively. Similarly, side wall-insulating films 46 are formed of silicon nitride films, and provided on side walls of the words lines 5 connecting the gate electrodes 22, respectively. Each of contact holes 51 of the bit lines 6, as explained in detail later, is self-aligned between associated adjacent two of the word lines 5, with associated side wall-insulating films 26 and 46 provided between said associated adjacent two word lines 5 and each contact hole 51.

Furthermore, as shown in FIGS. 3 and 4, the word lines 5 extend over the capacitors 3. The connection conductors 4, which connect the source diffusion layers 24 and the storage electrodes 34 of the capacitors 3, overlap the word lines 5 as viewed from above, and are connected to the storage electrodes 34 under the word lines 5.

Figure 6:
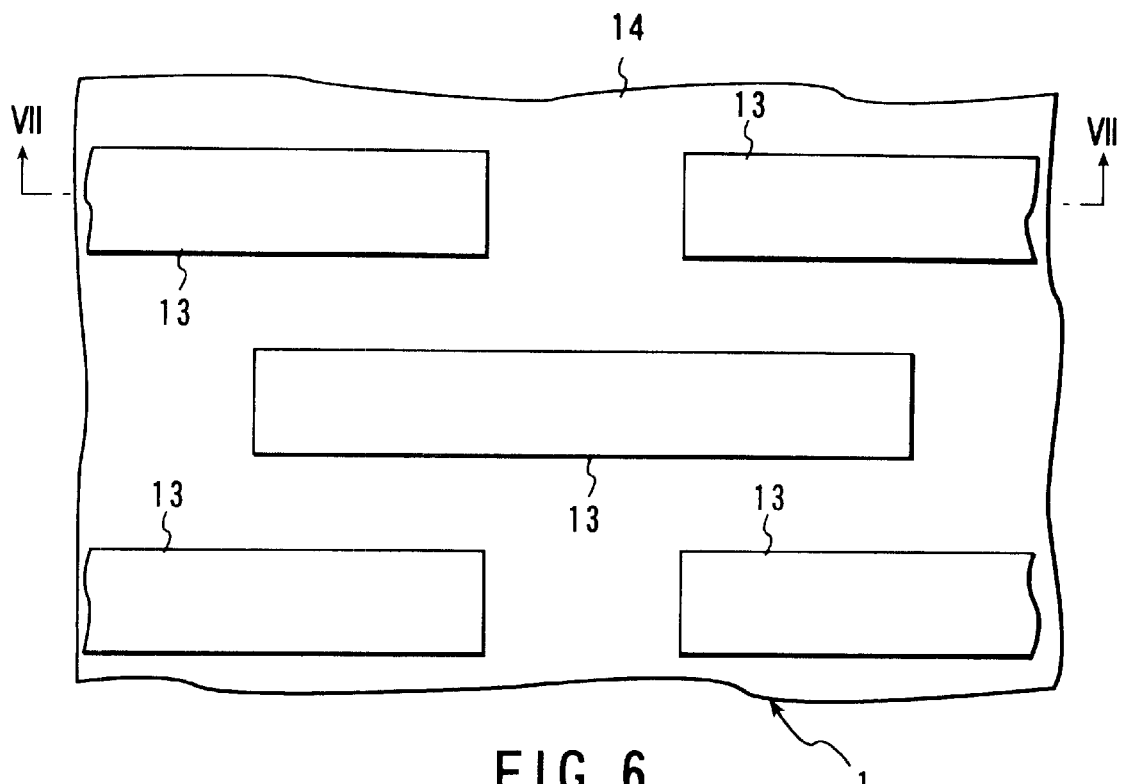
FIG. 6 is a plan view for illustrating a step of forming element regions in the DRAM according to the first embodiment.
Figure 7:
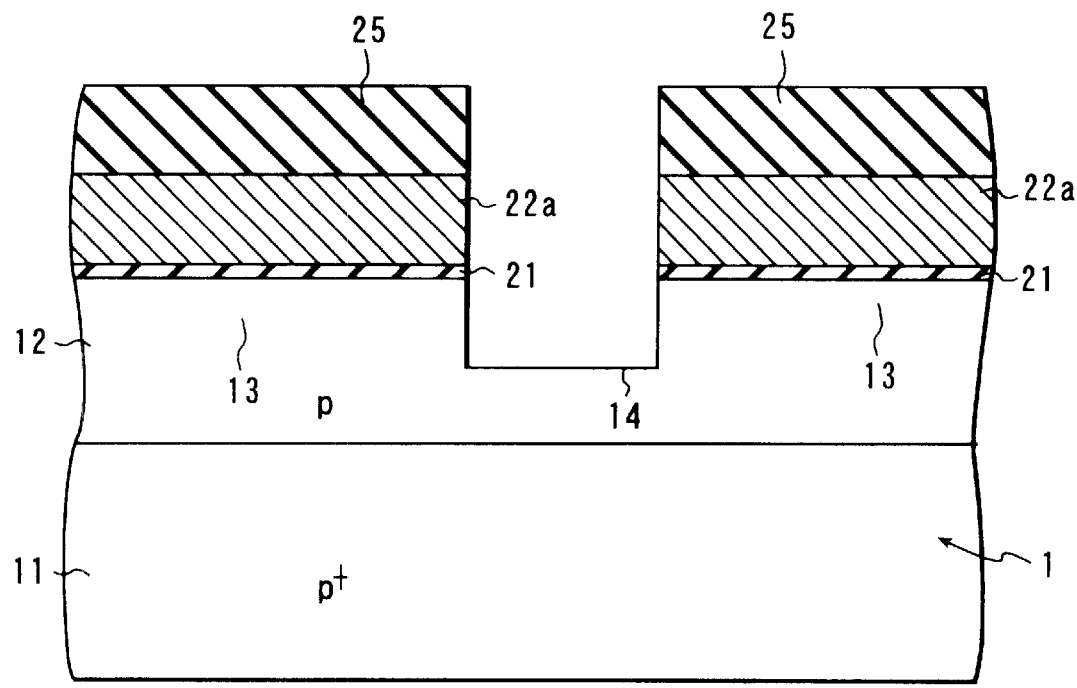
FIG. 7 is a cross-sectional view taken along line VII—VII in FIG. 6.

The manufacturing steps of the DRAM according to the first embodiment will be explained. FIG. 6 is a plan view for showing the substrate 1 and island-shaped element regions 13, and FIG. 7 is a cross-sectional view taken along line VII—VII of FIG. 6.

A polycrystal silicon film 22a having a thickness of approximately 100 nm is formed on the p-type well 12 of the substrate 1 as a gate electrode material, with a gate insulating film 21 interposed between the polycrystal silicon film 22a and the p-type well 12, and a silicon nitride film 25 having a thickness of approximately 100 nm is formed on the polycrystal silicon film 22a. Thereafter, an etching mask (not shown) is formed above regions to be formed as the elongated element regions 13, and the silicon nitride film 25, the polysilicon film 22a and the gate insulating film 21 are etched by using the etching mask, thus forming the element isolation grooves 14. Then, the substrate 1 is etched to, e.g., a depth of 200 nm by a reactive ion etching (RIE) method, forming the element isolation grooves 14. Thereby, the element regions 13 having elongated rectangular shapes as viewed from above are provided in such a manner as to be surrounded by the element isolation grooves 14, with the polycrystal silicon films (gate electrode material) 22a provided on the element regions 13.

Figure 8:
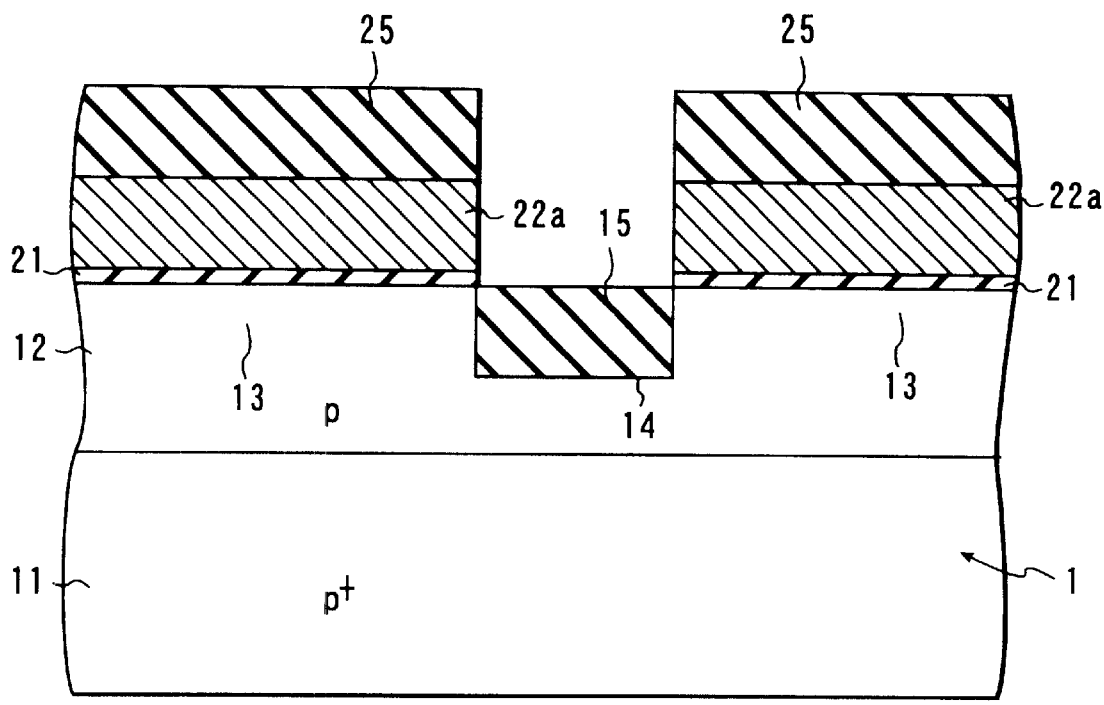
FIG. 8 is a plan view for illustrating a step of filling isolation insulating films in grooves in the DRAM according to the first embodiment.

Thereafter, a silicon oxide film having a thickness of about 400 nm is deposited above the entire substrate 1 by a CVD method, and then is subjected to anisotropic etching so that the silicon nitride films 25 remain in the element isolation grooves 14 as element isolation insulating films 15, as shown in FIG. 8.

Figure 9:
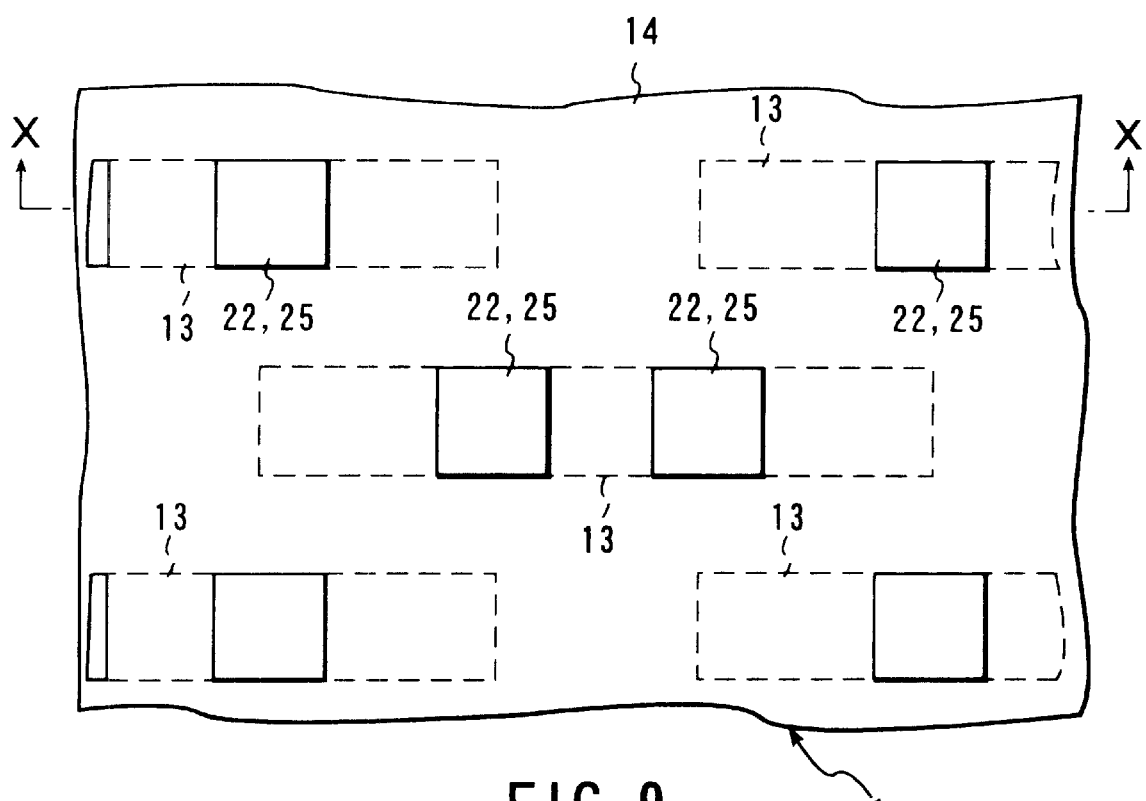
FIG. 9 is a cross-sectional view taken along line IX—IX in FIG. 8.
Figure 10:
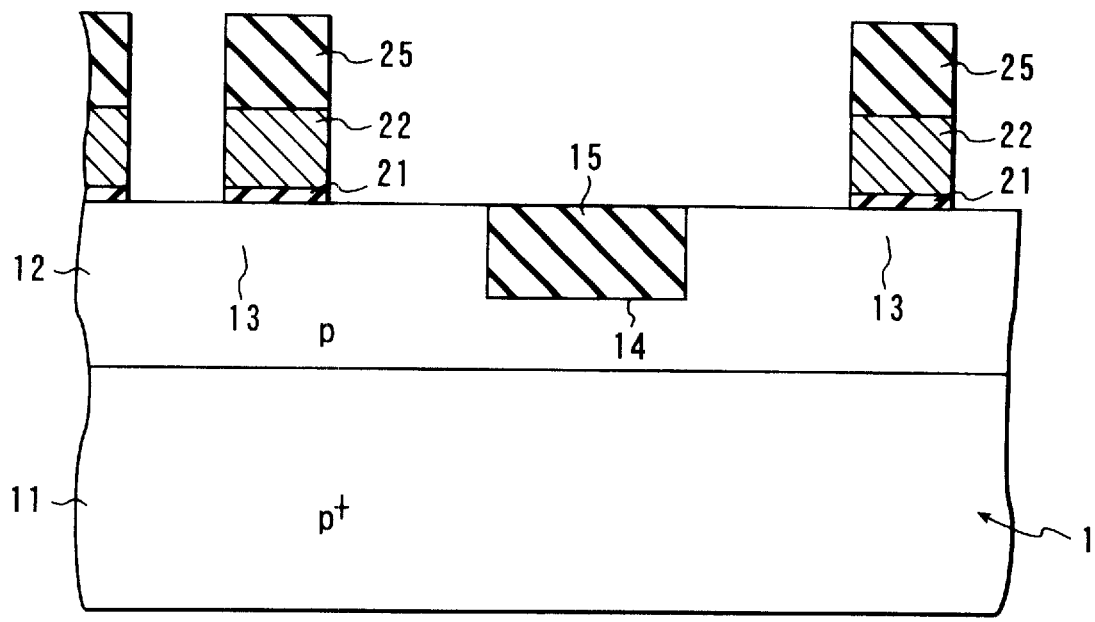
FIG. 10 is a plan view for illustrating a step of forming MOS transistors in the DRAM according to the first embodiment.

Then, the silicon nitride films 25 and the polycrystal silicon films 22a are processed by ordinary lithography and etching methods, to thereby form gate electrodes 22 above the element regions 13 as shown in FIGS. 9 (plan view) and 10 (cross-sectional view). In the Y direction indicated in FIG. 3, the polycrystal silicon films (the gate electrode material) 22a are patterned at the same time as the element regions 13 are processed. Therefore, in the above etching step, the polycrystal silicon films 22a are processed in the X direction indicated in FIG. 3, thereby forming the gate electrodes 22 having the same widths as the element regions 13 above the element regions 13.

Figure 11:
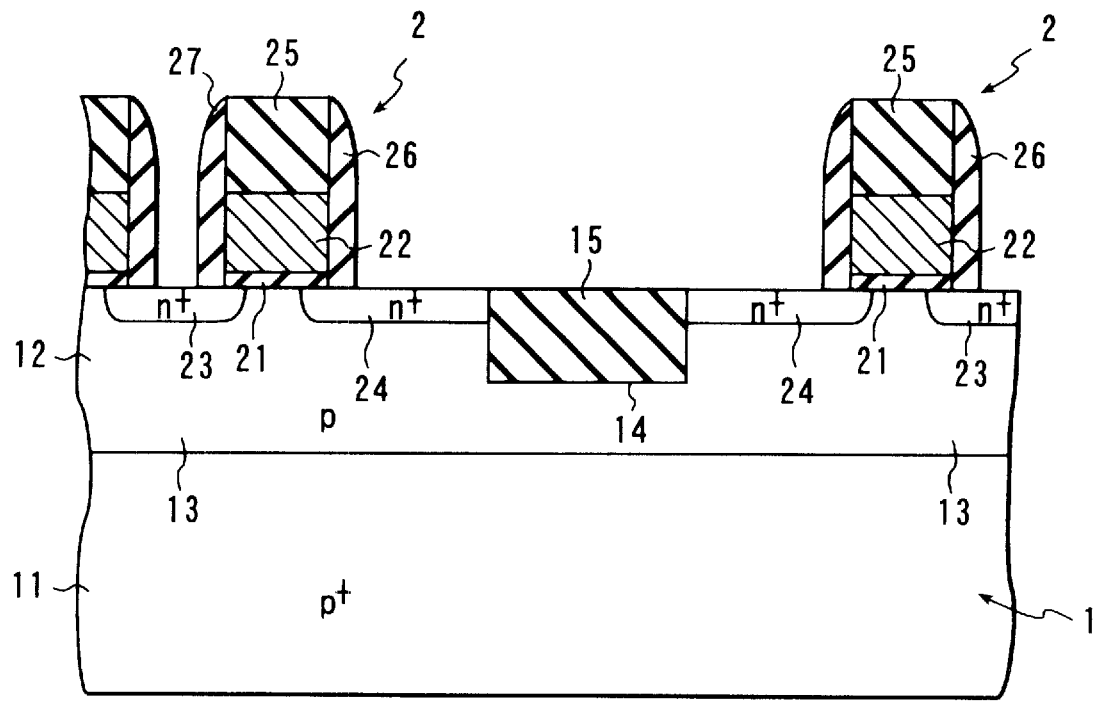
FIG. 11 is a cross-sectional view taken along line XI—XI in FIG. 10.

Next, as shown in FIG. 11, impurities are ion-implanted into the substrate 1, thereby providing $n^+$-type drain and source diffusion layers 23 and 24. To be more specific, for example, a dosage of $2\times10^{14}$ cm$^2$ of As (arsenic) is ion-implanted with an acceleration voltage of 15 KeV, and heat treatment for activating As is performed at 800° C. for 10 minutes in a nitrogen atmosphere, to thereby form the drain and source diffusion layers 23 and 24. Through the above steps, MOS transistors 2 are formed.

Thereafter, as shown in FIG. 11, side wall-insulating films 26 are formed on the side walls of the gate electrodes 22 and the side walls of the silicon nitride films 25 provided on the gate electrodes 22. Formation of the side wall-insulating films 26 is performed by etching using an anisotropic etching method such as RIE after a silicon nitride film is deposited above the entire substrate 1 by the CVD method.

Figure 12:
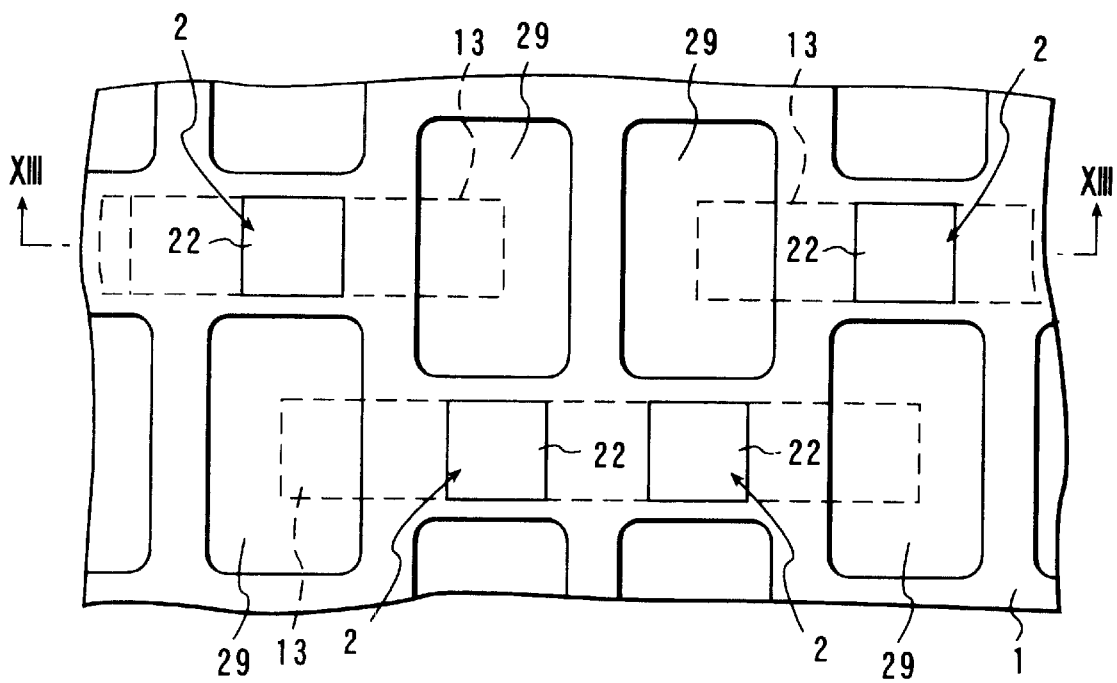
FIG. 12 is a plan view for illustrating a step of forming a mask for use in forming capacitors in the DRAM according to the first embodiment.
Figure 13:
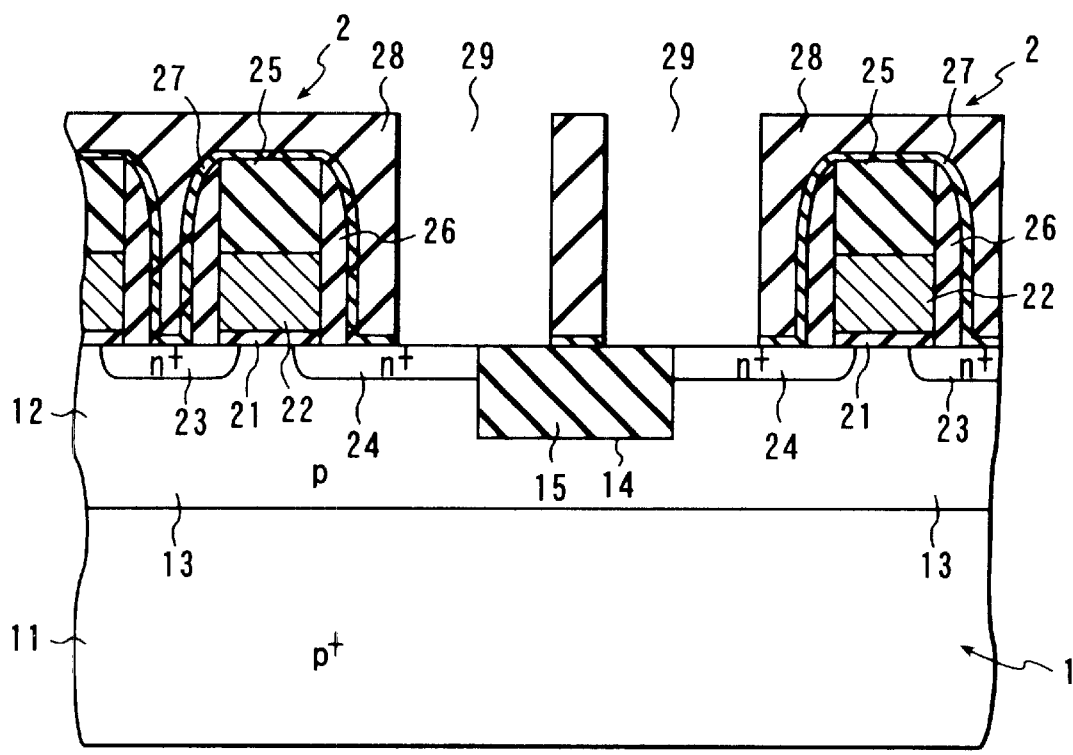
FIG. 13 is a cross-sectional view taken along line XIII—XIII in FIG. 12.

Next, silicon nitride films 27 each having a thickness of, e.g., 20 nm and boron-added silicon oxide films (BSG films) 28 each having a thickness of, e.g., 300 nm are deposited above the entire substrate 1, and then patterned by the ordinary lithography and etching as shown in FIG. 12 (plan view) and FIG. 13 (cross-sectional view), thus forming a mask for use in forming capacitor grooves having openings 29 at end portions of the element regions 13 as viewed from above. The silicon nitride films 27 serve to prevent impurities such as boron from being diffused from. the BSG films 28 to the silicon substrate 1, and serve as etching stoppers when the BSG films 28 are eliminated by etching. After formation of the mask, the insulating films 15 filled in the insulating isolation grooves 14 are eliminated (not shown).

Figure 14:
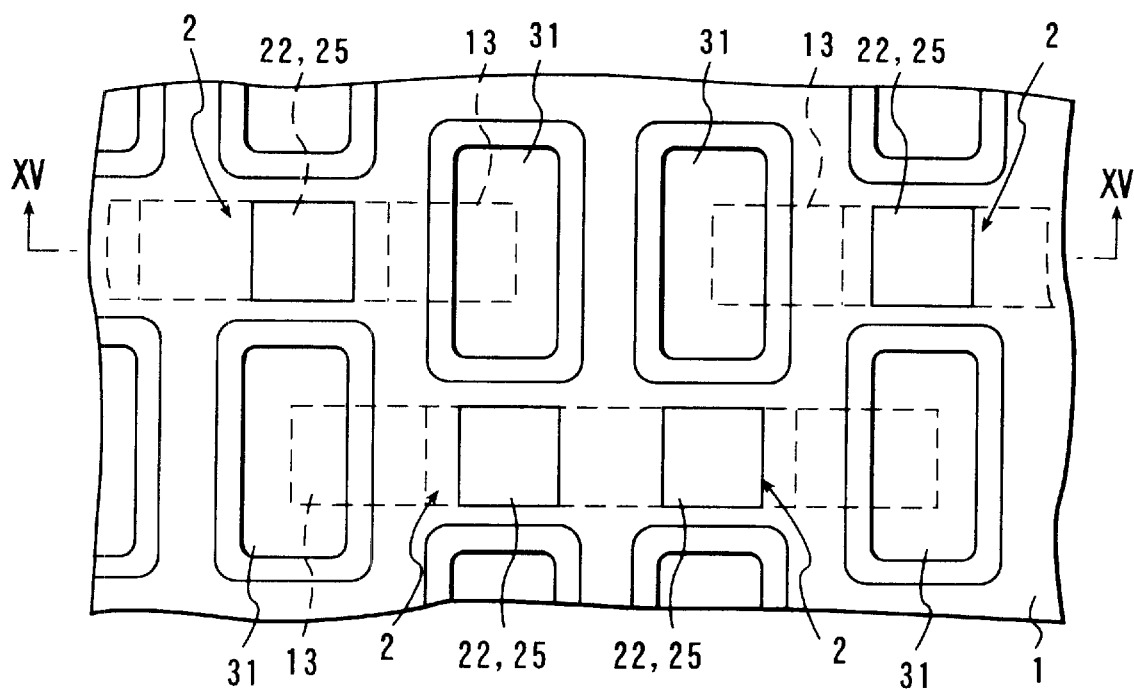
FIG. 14 is a plan view for illustrating the first stage of a step of forming capacitor grooves in the DRAM according to the first embodiment.
Figure 15:
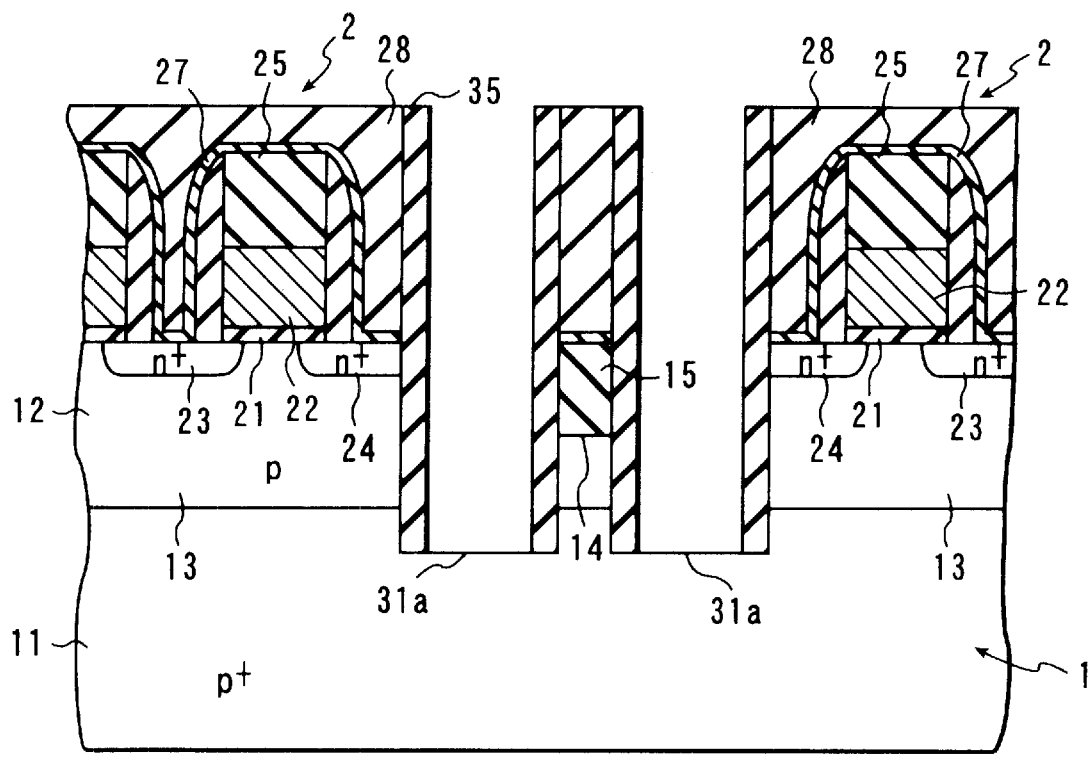
FIG. 15 is a cross-sectional view taken along line XV—XV in FIG. 14.

Then, the substrate 1 is etched to a depth of, e.g., 500 nm, forming capacitor grooves 31, as shown in FIG. 14 (plan view) and FIG. 15 (cross-sectional view). Thereafter, insulating films 35 are formed on side walls of the capacitor grooves 31a. Formation of the insulating films 35 is achieved in the following manner: a silicon oxide film having a thickness of 25 nm is deposited above the entire substrate 1 by, e.g., the CVD method, and is subjected to anisotropic etching such as RIE. In the above case, the bottom surfaces of the capacitor grooves 31a are not covered by the insulating films 35.

Figure 16:
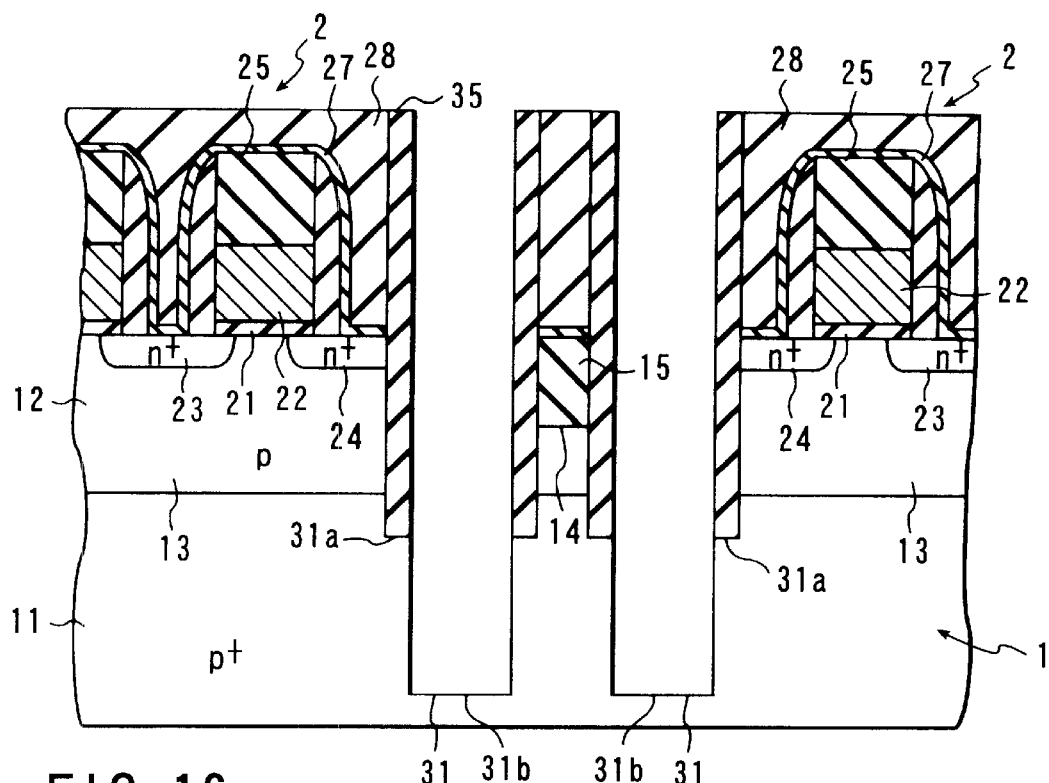
FIG. 16 is a cross-sectional view for illustrating the second stage of the step of forming the capacitor grooves in the DRAM according to the first embodiment.

The exposed bottom surfaces of the capacitor grooves 31a are further etched by performing anisotropic etching such as RIE by using the BSG films 28 and the insulating films 35 as a mask, as a result of which capacitor grooves 31b are formed as shown in FIG. 16. In such a manner, first, the capacitor grooves 31a are formed, and then the capacitor grooves 31b are formed, thereby completing formation of the capacitor grooves 31. In other words, the capacitor grooves 31 have been completely formed through the above two stages, and each of the capacitor grooves 31 has a depth of about 800 nm.

Figure 17:
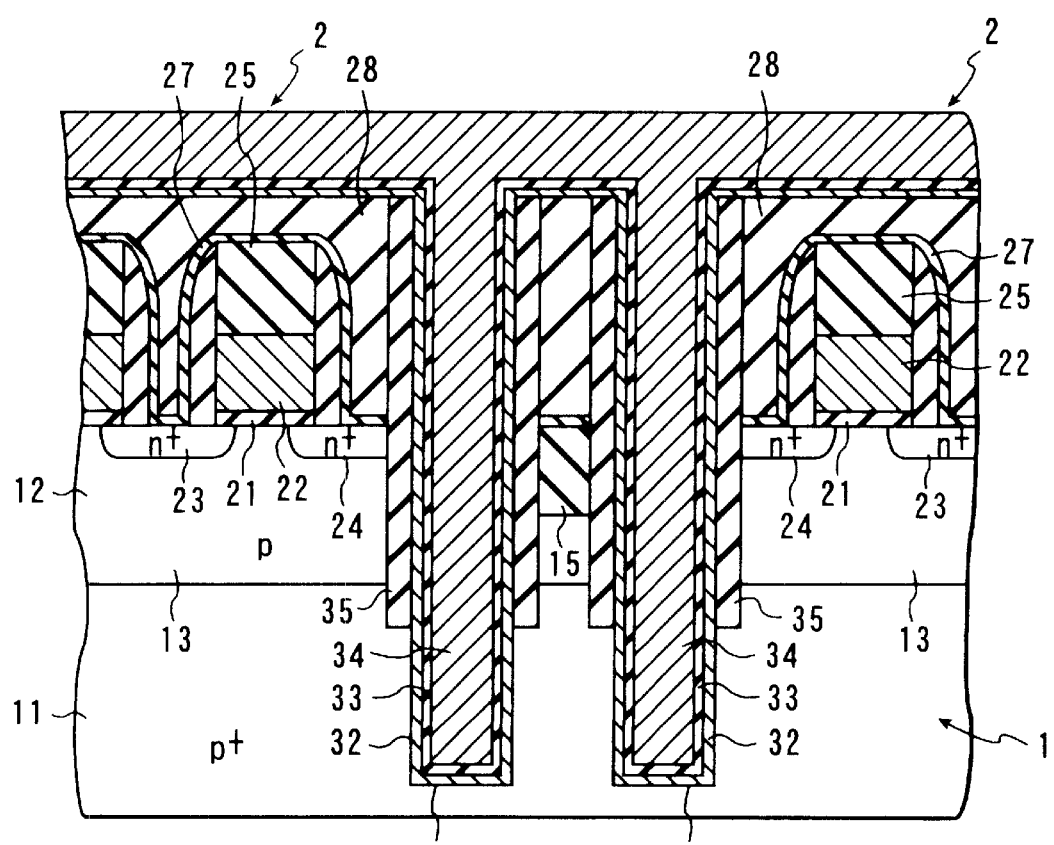
FIG. 17 is a cross-sectional view taken along line XVII—XVII in FIG. 16.

After the above manufacturing steps, as shown in FIG. 17, the plate electrodes 32, the capacitor insulating films 33, and the storage electrodes 34 are successively deposited. To be more specific, formation of each plate electrode 32 is achieved in the following manner: a titanium (Ti) film having a thickness of 20 nm is deposited by the CVD method, then a titanium nitride (TiN) film is deposited by the CVD method, and lastly heat treatment is performed at 600° C. for 30 minutes in a nitrogen atmosphere. As a result, the Ti film portion of each plate electrode 32, which contacts the substrate 1, reacts with silicon, thus forming a titanium silicide (TiSi$_2$) film. Furthermore, strontium ruthernium oxide (SRO) films each having a thickness of 20 nm are formed on surfaces of the plate electrodes 32 by the CVD method. The capacitor insulating films 33 are formed of barium strontium titanium oxide (BSTO) films each of 20 nm provided by, e.g., the CVD method. The storage electrodes 34 are constituted by SRO films each having a thickness of 200 nm and deposited by the CVD method to be completely filled in the grooves 31.

Figure 18:
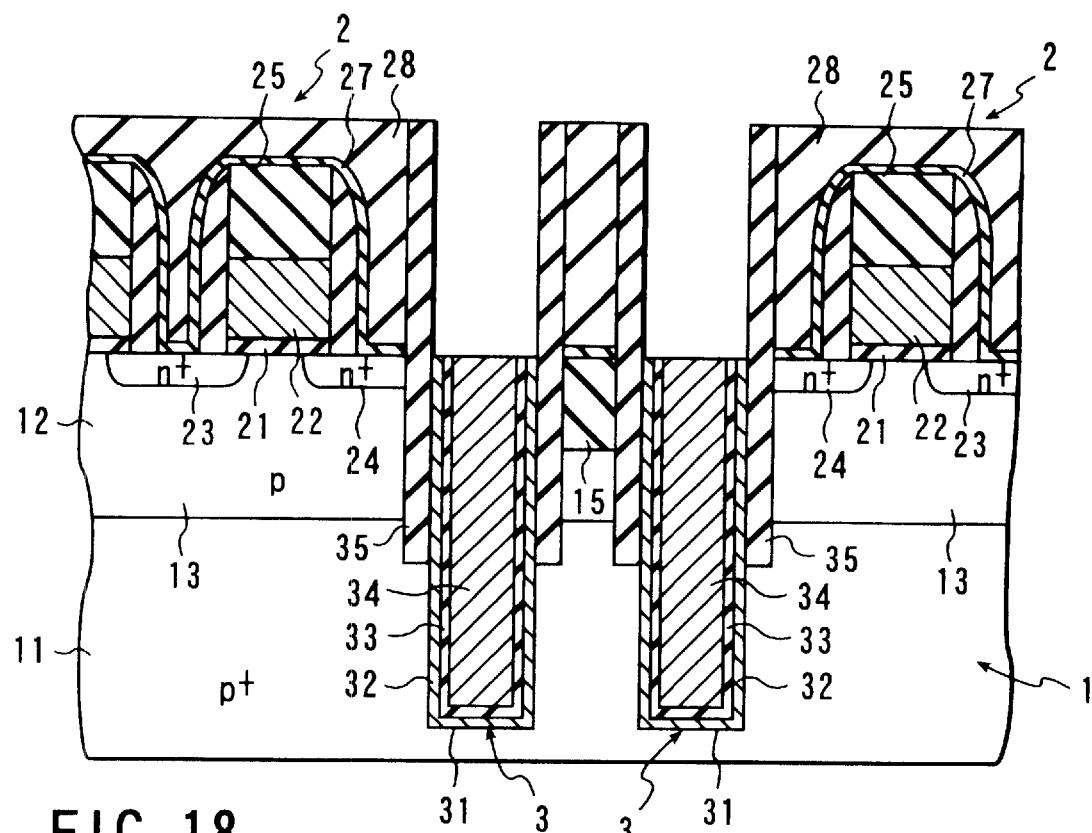
FIG. 18 is a cross-sectional view for illustrating a step of forming capacitors in the DRAM according to the first embodiment.

Next, those portions of the storage electrodes 34 which are deposited above the BSG films 28 are eliminated by a CMP technique, and further the remaining portions of the storage electrodes 34 are etched back within the capacitor grooves 31 to a level equal to the level of the surface of the substrate 1. Then, the exposed portions of the capacitor insulating films 33 and plate electrode 32 are eliminated by CDE (Chemical Dry Etching), thereby obtaining a structure as shown in FIG. 18.

Figure 19:
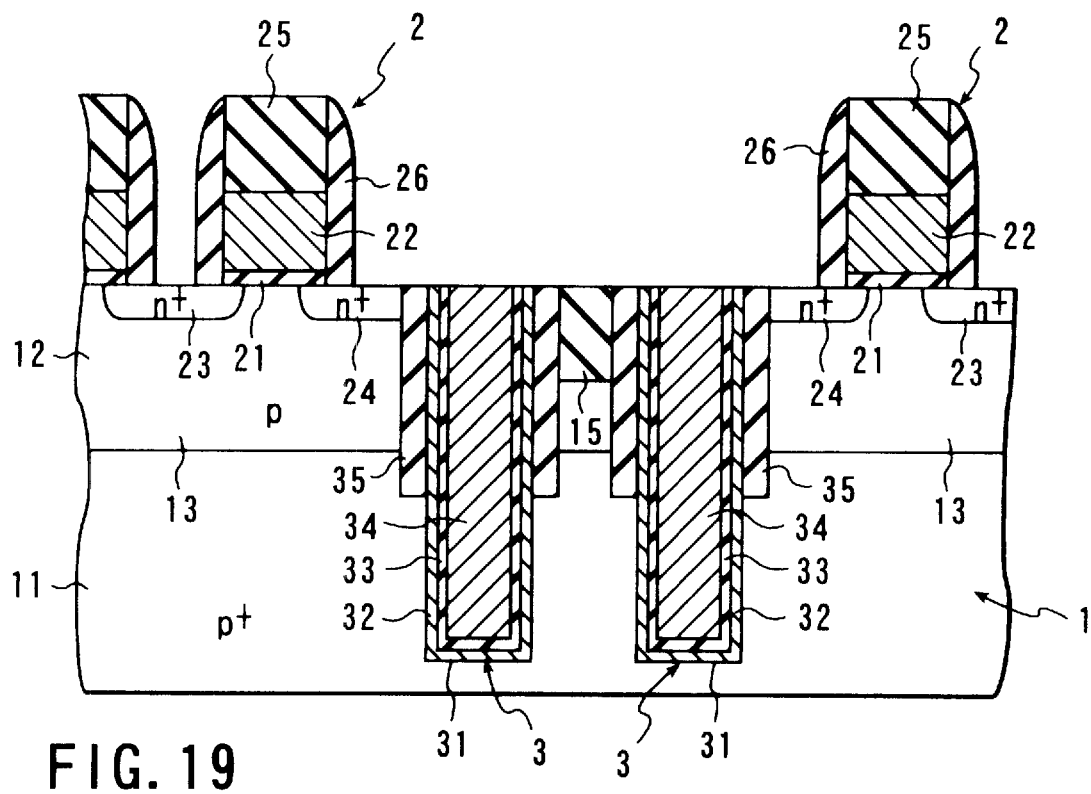
FIG. 19 is a cross-sectional view for illustrating a step of eliminating unnecessary insulating films after formation of the capacitors in the DRAM according to the first embodiment.

Then, as shown in FIG. 19, etching is performed using, e.g., an ammonium fluoride solution to eliminate the BGS films 28 and those portions of the side wall-insulating films 35, formed on the capacitor grooves 31, which are located higher than the substrate 1. At this time, the silicon nitride films 27 function as etching stoppers. Thereafter, the silicon nitride films 27 are eliminated by etching using heated phosphoric acid. Due to the above steps, each of the capacitors 3 has been completely formed to have a trench structure as shown in FIG. 19.

Next, a silicon oxide film 41 is deposited above the entire substrate 1 such that gate electrode portions projecting from the substrate 1 are buried in the silicon oxide film 41, and then it is eliminated by the CMP technique until the silicon nitride films 25 are exposed to the outside. As a result, the silicon oxide film 41 is divided into silicon oxide films 41. They are filled in the gaps provided between the gate electrodes 22.

Figure 20:
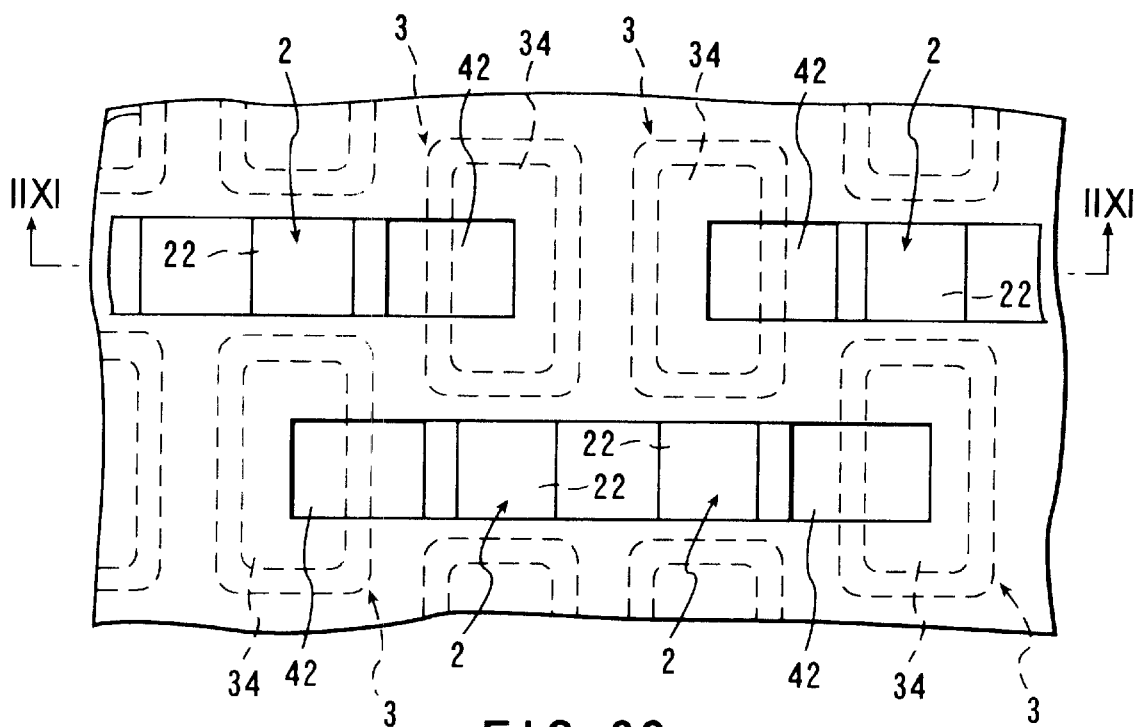
FIG. 20 is a plan view for illustrating a step of forming a mask for use in provision of connection conductors in the DRAM according to the first embodiment.
Figure 21:
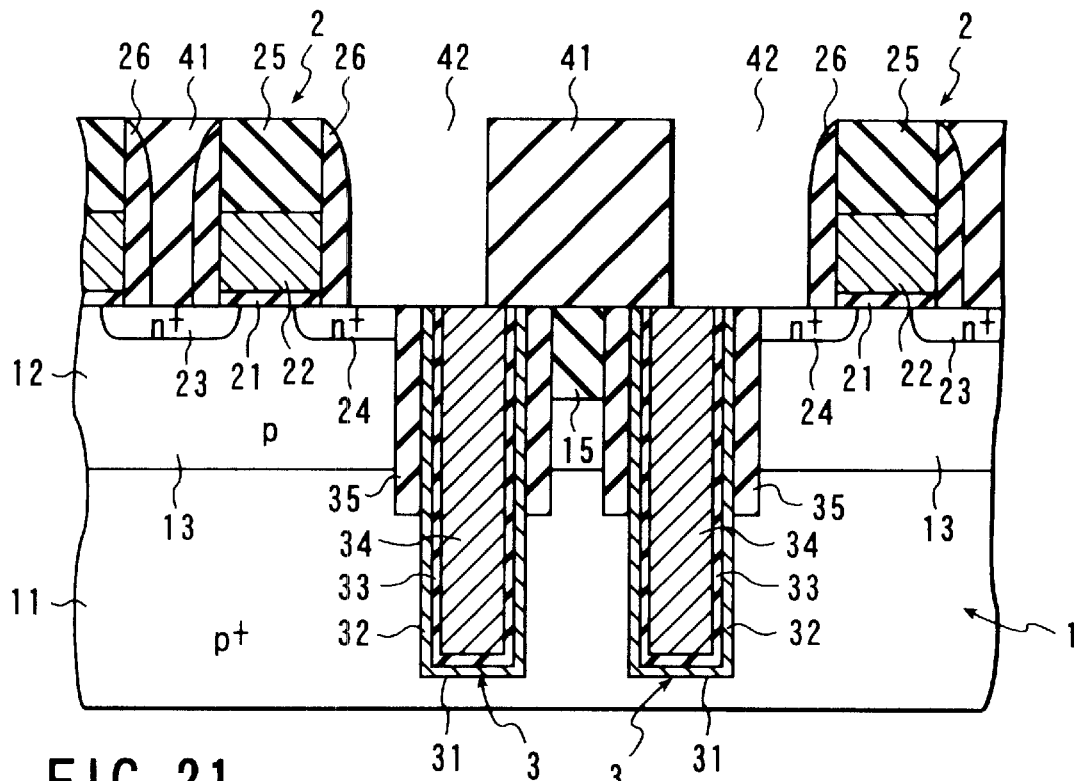
FIG. 21 is a cross-sectional view taken along line IIXI—IIXI in FIG. 20.

Furthermore, using the ordinary lithography and etching techniques, openings 42 are formed in the regions which bridge the storage electrodes 34 of memory cells and the source diffusion layers 24. This state is shown in FIG. 20 (plan view) and FIG. 21 (cross-sectional view).

Figure 22:
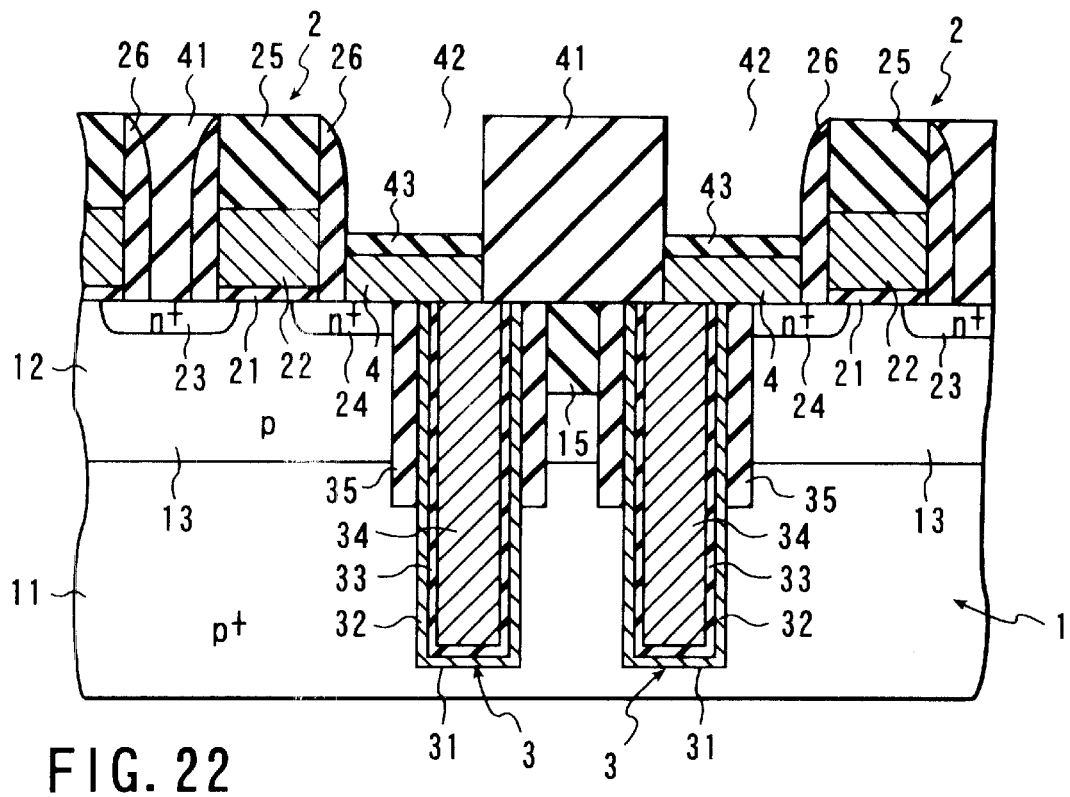
FIG. 22 is a cross-sectional view for illustrating a step of providing the connection conductors in the DRAM according to the first embodiment.

Thereafter, within the openings 42, the connection conductors 4, as shown in FIG. 22, are provided to connect the storage electrodes 34 and the source diffusion layers 24. In this step, for example, a polycrystal silicon film having a thickness of approximately 200 nm is deposited above the entire substrate 1 by the CVD method, and then is eliminated by etching-back or the like until the silicon nitride films 25 on the gate electrodes 22 are exposed to the outside. Etching-back is further carried out until the thickness of each of the polycrystal silicon films remaining in the openings 42 is decreased to about 50 nm. The remaining silicon films therein serve as the connection conductors 4.

Figure 23:
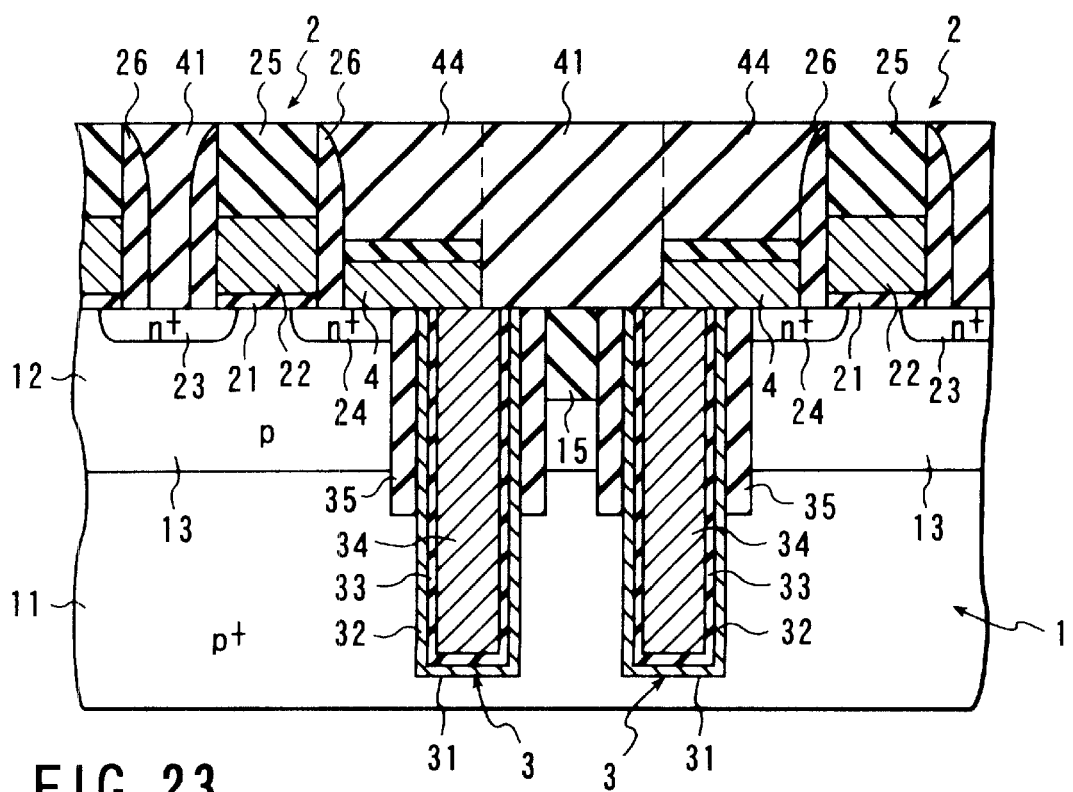
FIG. 23 is a cross-sectional view for illustrating a step of flattening an upper surface after the connection conductors are provided in the DRAM according to the first embodiment.

In the openings 42, silicon nitride films 43 each having a thickness of about 100 nm are provided on the connection conductors 4, and further the openings 42 are completely filled with silicon oxide films 44 such that their upper surfaces are flat as shown in FIG. 23.

Figure 24:
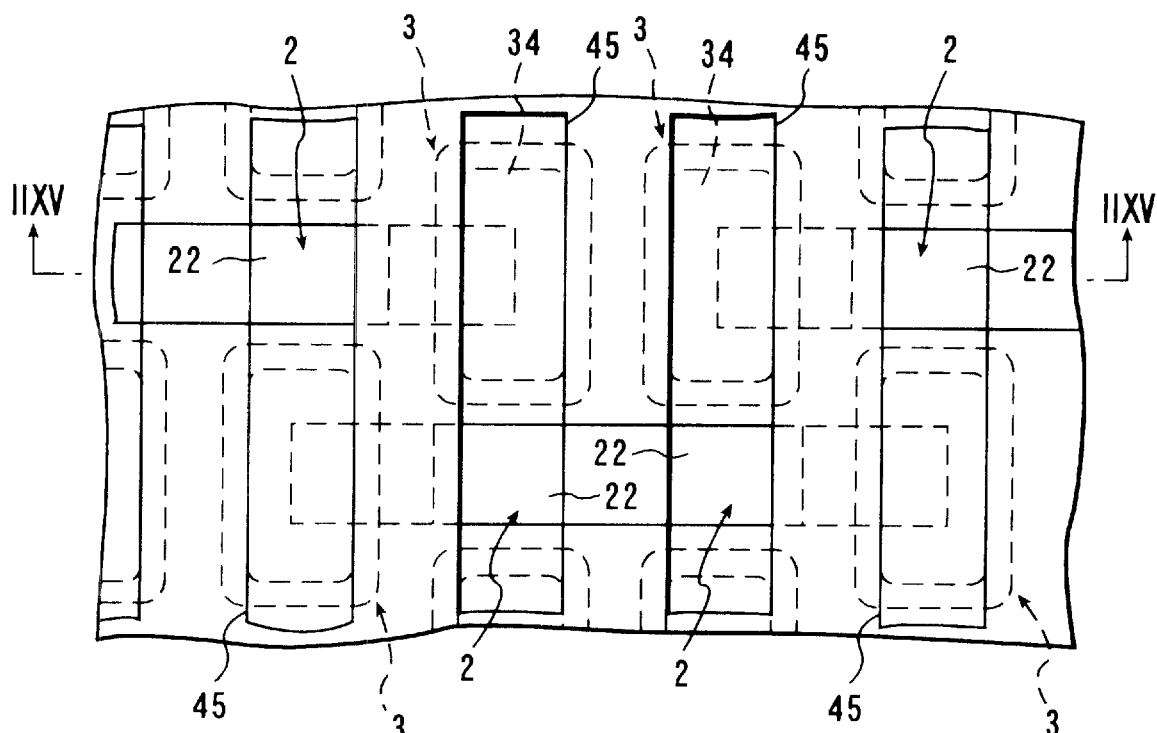
FIG. 24 is a plan view for illustrating a step of forming grooves for provision word lines in the DRAM according to the first embodiment.
Figure 25:
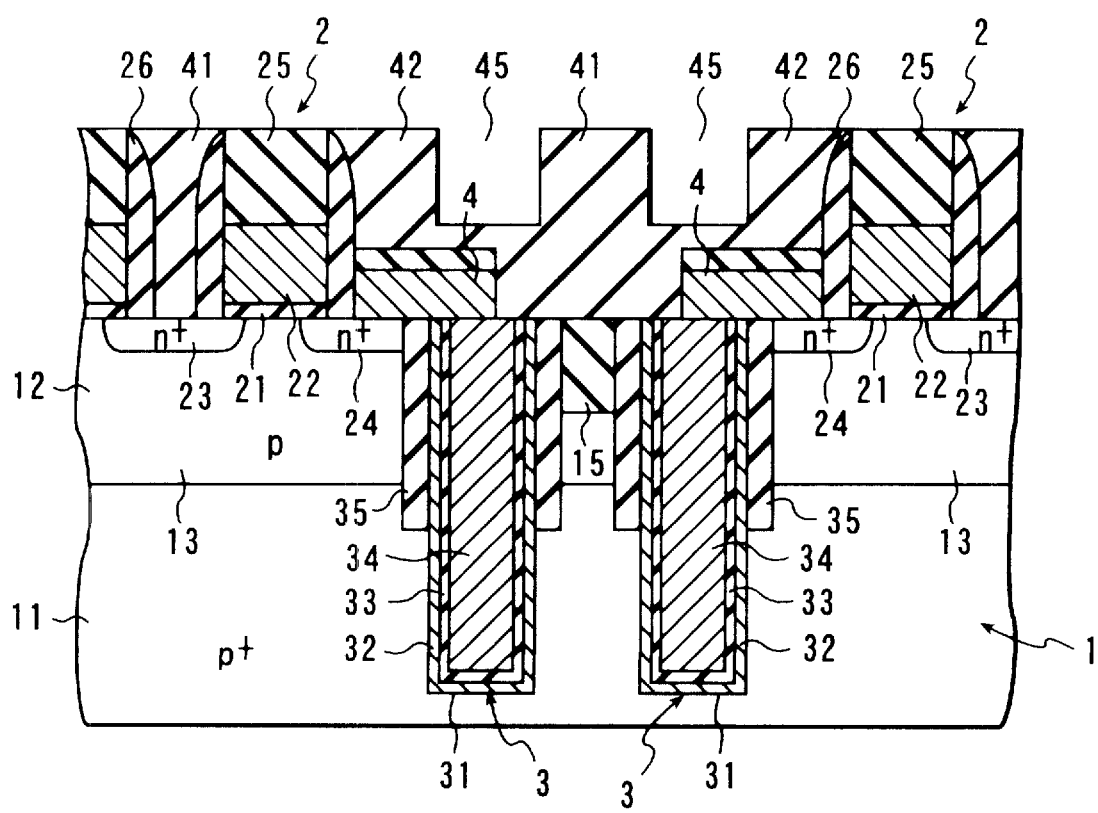
FIG. 25 is a cross-sectional view taken along line IIXV—IIXV in FIG. 24.

Furthermore, as shown in FIG. 24 (plan view) and FIG. 25 (cross-sectional view), the silicon oxide films 41 and 44 are processed to have grooves 45 each having a depth of about 200 nm for use in provision of word lines, by the ordinary lithography and etching methods. At this time, no grooves 45 are located on the gate electrodes 22 since the silicon nitride films 25 are formed on the gate electrodes 22. Thus, the silicon nitride films 25 thereon are eliminated by the CDE method, thus exposing the gate electrodes 22 to form grooves 45 thereon. In this case, elimination of the silicon nitride films 25 is carried out by anisotropic etching such as RIE, and thus only the silicon nitride films 25 can be eliminated. In other words, the side wall-insulating films 26 are not removed. Thereafter, a silicon nitride film 46 having a thickness of about 50 nm is deposited above the entire substrate 1, and then is etched back by RIE such that it remains on the side walls of the grooves 45 as the side wall-insulating films 46.

Figure 27:
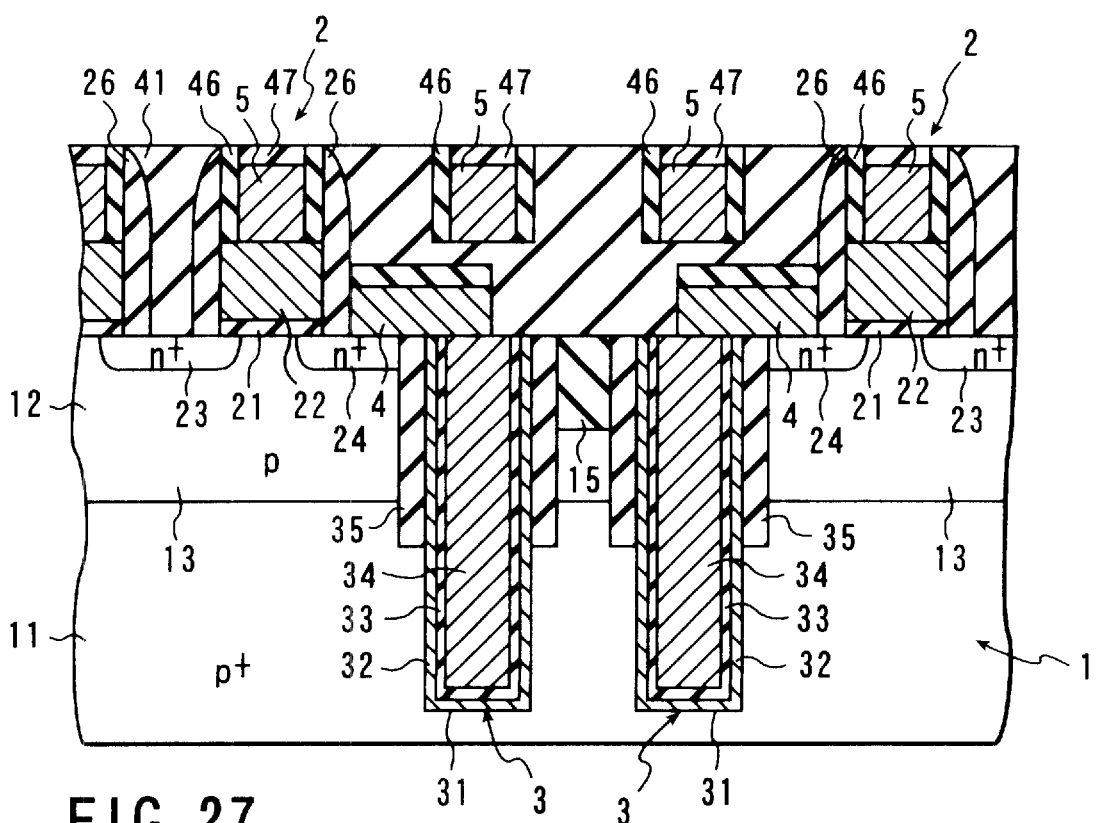
FIG. 27 is a cross-sectional view for illustrating a step of providing the word lines in the grooves in the DRAM according to the first embodiment.

Next, the word lines 5 are provided in the grooves 45 as shown in FIG. 27. They are formed in the following manner:
a tungsten (W) film having a thickness of 200 nm is deposited by the CVD method, and then is etched by the CMP or RIE such that it remains only within the grooves 45. In addition, silicon nitride films 47 are provided on the word lines 5 formed of W films.

The gate electrodes 22 of the MOS transistors 2, as mentioned above, are arranged in rows in the Y direction. The gate electrodes 22 of each row are connected to each other by an associated one of the word lines 5 due to the above steps. The word lines 5, as shown in FIG. 27, are extended over the capacitors 3, with the connection conductors 4 buried between the word lines 5 and the capacitors 3.

Thereafter, as shown in FIG. 4, a silicon oxide film 50 having a thickness of, e.g., 200 nm is formed as an interlayer insulating film. Then, by the ordinary lithography and etching methods, the silicon oxide film 50 is patterned to expose the drain diffusion layers 23 of the MOS transistors 2, in order for provision of the contact holes 51 of the bit lines 6. In this case, the silicon oxide film 50 and the silicon oxide films 41 are subjected to etching which is performed on the silicon nitride film at a sufficiently high rate. Thus, each of the contact holes 51 is self-aligned between associated adjacent two of the word lines 5, with the side walls of the word lines 5 protected by the silicon nitride films 26 and 46. Lastly, the bit lines 6 are formed of, e.g., W films such that each of the bit lines 6 connect the diffusion layers 23 of associated ones of the MOS transistors 2 arranged in rows in the X direction. Consequently, a DRAM memory cell array is provided.

As mentioned above, according to the first embodiment, the gate electrodes 22 of the MOS transistors 2 have the same widths as the element regions 13, and are located above the element regions 13. The word lines 5 are formed of conductive layers differing from layers constituted by the gate electrodes 22 (which are located under the word lines 5). In the conventional DRAM in which the gate electrodes are included in the word lines, the floating capacitances between the bulk regions and the regions which are located outside the element regions as viewed from above are large.

On the other hand, in the first embodiment, the gate electrodes 22 are provided only above the element regions 13 as is clear from FIG. 5 (cross-sectional view) corresponding to FIG. 2 showing the prior art. In addition, the insulating films 41, each having a thickness substantially equal to that of the gate electrode 22, are provided above the outsides of the element regions 13. Due to this structure, the floating capacitances of the word lines 5 are far smaller than those of the conventional DRAM. Thus, the DRAM of the present invention can operate at a higher speed.

Furthermore, in the manufacturing process of the first embodiment, the capacitors 3 each having a trench structure are formed after the MOS transistors 2 have been completely formed. Thus, even if BSTO films which are high dielectric constant materials are used as the capacitor insulating films 33, the characteristics of the capacitor insulating films 33 do not degrade. This is because a high temperature heating step is not carried out after formation of the capacitor insulating films 33. Therefore, each of the capacitor insulating films 33 has a high dielectric constant, and does not generate leakage current or the like. In other words, each capacitor insulating film 33 is stable. By virtue of the above features, the capacitor grooves 31 do not need to be extremely deeply formed. Therefore, it is not necessary to provide a large area for the capacitor 3. In other words, the capacitor 3 can have a great capacitance in a small area.

Furthermore, according to the first embodiment, single-crystal high dielectric constant material films may be used as the capacitor insulating films 33. Use of those high dielectric constant material films enables the capacitor grooves 31 to be made deeper, thus providing a sufficient great storage capacitance. To be more specific, it is known that TiN is epitaxially grown on a silicon substrate or on single-crystallized $TiSi_2$. Also, an SRO film is epitaxially grown on the epitaxially grown TiN. Further, a BSTO film can be epitaxially grown on the epitaxially grown SRO film. Therefore, as explained with respect to the first embodiment, if a capacitor structure is provided which contains $TiSi_2$, TiN, SRO and BSTO, all these components can be single-crystallized, and thus a great storage capacitance can be obtained. As a result, the resultant capacitor insulating film corresponds to a capacitor insulating film which is formed of a silicon oxide film to have a thickness of 0.1 nm.

Moreover, in the first embodiment, the $p^+$-type silicon substrate 11 is used as plate wiring. The SRO films are provided to ohmic-contact the $p^+$-type silicon substrate 11, and function as main portions of the plate electrodes. Therefore, in this structure, it is unnecessary to provide a step of forming plate wiring since, as mentioned above, the $p^+$-type silicon substrate 11 is used as the plate wiring. As a result, the manufacturing process is simplified, and the yield is improved.

Furthermore, in the first embodiment, the word lines 5 are formed after formation of the connection conductors 4 which connect the source diffusion layers 24 of the MOS transistors 2 and the storage electrodes 34 of the capacitors 3. Accordingly, the word lines 5 can be formed to be located above the connection conductors 4. Thus, the first embodiment solves the following problem of the conventional DRAM wherein the gate electrodes and the word lines are formed in the same layers.

In the conventional DRAM, each of the connection conductors must be provided in a small region between associated adjacent two word lines. Therefore, if the word lines are provided at shorter intervals to achieve a higher integration density, the contact areas between the storage electrodes and the connection conductors are reduced, and the connection resistances between the diffusion layers and the storage electrodes are increased.

On the other hand, in the first embodiment, the connection conductors 4 can be provided below the word lines 5 in such a way as to partially overlap the word lines 5 as viewed from above, regardless of the distances between the word lines 5. By virtue of this feature, the contact areas between the connection conductors 4 and the storage electrodes 34 are sufficiently great, and thus the connection resistances between the diffusion layers and the storage electrodes 34 are small.

In the manufacturing method in the first embodiment, the source and drain diffusion layers are formed after the gate electrodes 22 are processed to be island-shaped. Simultaneously, when impurities are ion-implanted into the gate electrodes 22 and the diffusion layers of the MOS transistors 2 in the peripheral circuit portion which is located outside the memory cell array, surface-channel type MOS transistors and PMOS transistors can be formed. To be more specific, arsenic is ion-implanted into the gate electrodes and the diffusion layers of NMOS transistors, and boron is ion-implanted into the gate electrodes and the diffusion layers of PMOS transistors.

In a conventional manufacturing process for manufacturing MOS transistors, impurities are ion-implanted into gate electrodes, with a monocrystal silicon film deposited above the entire surface of a substrate. In this process, there is a possibility that electrical characteristics such as the threshold value may be adversely affected due to an effect wherein the arsenic and boron are minutely diffused in the polycrystal silicon in a heating step subsequent to the above ion-implantation. In contrast, such a problem does not arise in the manufacturing method of the first embodiment, since ion-implantation of impurities is carried out after the gate electrodes are processed to be island-shaped. Thus, the first embodiment can reduce the area of the peripheral circuit since it is not necessary to consider the mutual diffusion of the impurities.

In addition, in the first embodiment, the silicon nitride film is deposited on the gate electrode material film 22a before patterning the gate electrodes 22, and the silicon nitride film is processed to be island-shaped at the same time as patterning of the gate electrodes 22 is performed. Then, the grooves for provision of the word lines are formed, after forming the MOS transistors 2, the capacitors 3, and the connection conductors between the MOS transistors 2 and the capacitors 3, and forming a silicon oxide film provided with a flat surface. Then, the silicon nitride films 25 on the gate electrodes 22 exposed within the grooves are eliminated. Due to such a manufacturing method, the contact portions of the word lines 5 can be self-aligned with the gate electrodes 22. In addition, the contact holes 51 of the bit lines 6 can be self-aligned between the word lines 5 by utilizing the difference in etching rate between the silicon nitride film and the silicon oxide film. The side wall-insulating films formed of silicon nitride films are interposed between the contact holes 51 of the bit lines 5 and the gate electrodes 22. Hence, even if the word lines are arranged at a small pitch, the word lines and the bit lines can be reliably prevented from short-circuiting, and the contact holes 51 can be located between the word lines 5.

In the first embodiment, W films are used as the material of the word lines 5. However, metal such as Al or a metal silicide film such as $TiSi_2$ or $WSi_2$ may be used instead of the W films. Also, metal such as Al may be used as the material of the bit lines 6.

Furthermore, according to the above explanation for the first embodiment, the connection conductors 4 are formed of polycrystal silicon. However, they may be formed of conductive films such as WI $WSi_2$, TiN or amorphous silicon films. Furthermore, according to the explanation, they are formed by performing etching-back (the film provided above the entire substrate is etched-back) and filling (openings formed due to etching-back are filled with another films). However, they may be selectively grown. In this case, W, Si or the like can be used as the material of the connection conductors 4.

Further, in the capacitors 3 of the first embodiment, each of the plate electrodes 32 contacting the $p^+$-type silicon substrate 11 is constituted by SRO and a laminated film containing $TiSi_2$ and TiN, the SRO being provided on the laminated film. However, they may be formed only of SRO and TiN or only SRO. In other words, $TiSi_2$ may not be used and, additionally, both of $TiSi_2$ and TiN may not be used as the material of the plate electrodes 32. In addition, ruthenium oxide ($RuO_2$), ruthenium (Ru), platinum (Pt), a tungsten nitride (WN) film, tungsten (W), a titanium nitride (TiN) film or the like may be used as the material of the plate electrode 32 instead of SRO. Any of those materials may also be used as the material of the storage electrode 34.

Moreover, in addition to the BSTO film, $Ta_2O_5$, TiN, $TaO_2$, SiN or the like may be used as the material of the capacitor insulating film 33.

Figure 26:
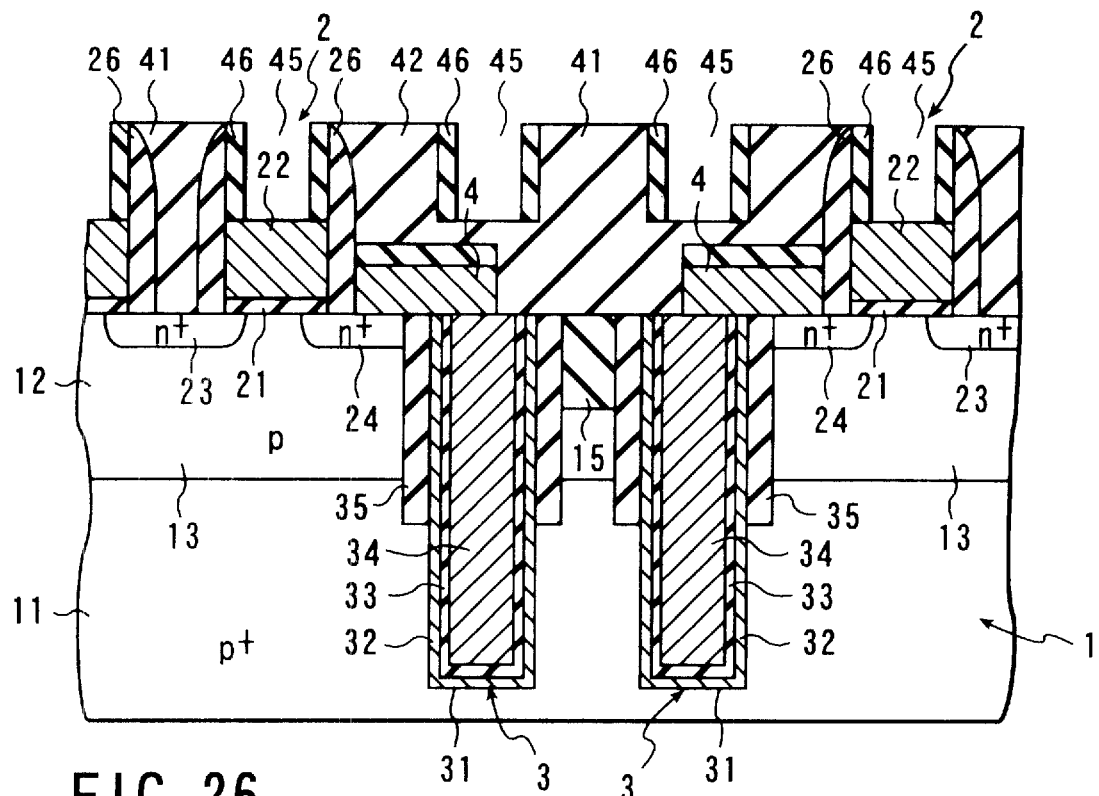
FIG. 26 is a cross-sectional view for illustrating a step of exposing gate electrodes to the grooves for provision of the word lines in the DRAM according to the first embodiment.
Figure 28:
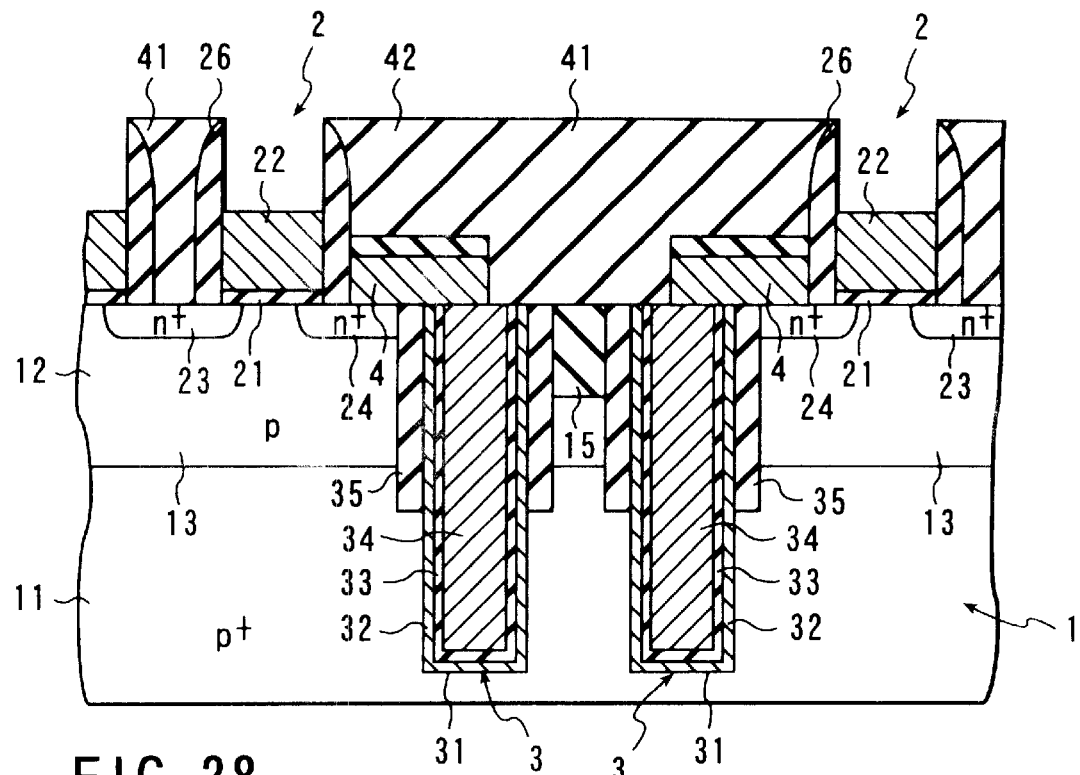
FIG. 28 is a cross-sectional view for illustrating a step of forming grooves for provision of word lines in a DRAM according to the second embodiment of the present invention.
Figure 29:
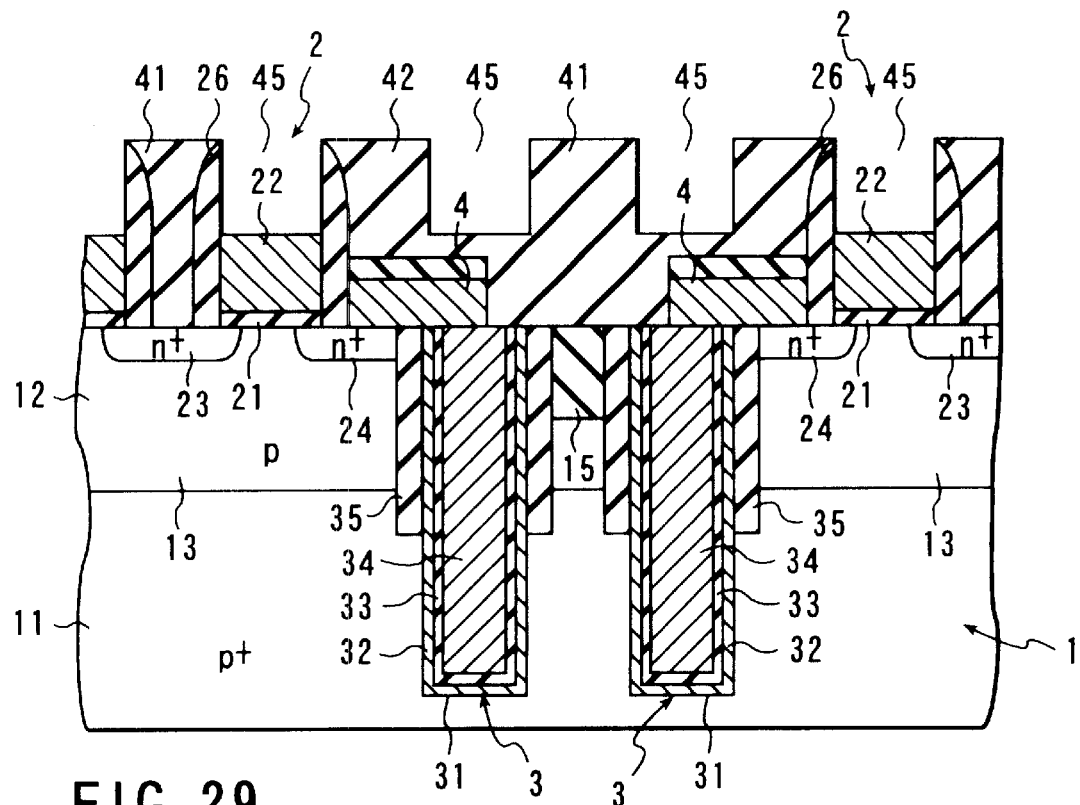
FIG. 29 is a cross-sectional view for illustrating the step of forming the grooves for provision of the word lines in the DRAM according to the second embodiment.

Next, the manufacturing method according to the second embodiment of the present invention will be explained as follows:

FIGS. 28 and 29 show formation of the grooves 45 for provision of the word lines 5, in contradistinction to FIGS. 25 and 26 for illustrating the first embodiment.

In the first embodiment, as shown in FIG. 25, the silicon nitride films 25 on the gate electrodes 22 are eliminated after forming the grooves 45 for provision of the word lines 5. On the other hand, in the second embodiment, the grooves 45 are formed by RIE or the like after eliminating the silicon nitride films 25 on the gate electrodes 22 as shown in FIG. 29.

To be more specific, according to the manufacturing method of the second embodiment, the gate electrodes 22 are prevented from being etched, even if misalignment occurs in the lithography. step of forming the grooves 45. This is because in a resist development step, resists 60 remain in the regions provided on the gate electrodes 22 after the silicon nitride films 25 are eliminated from the regions.

Figure 30:
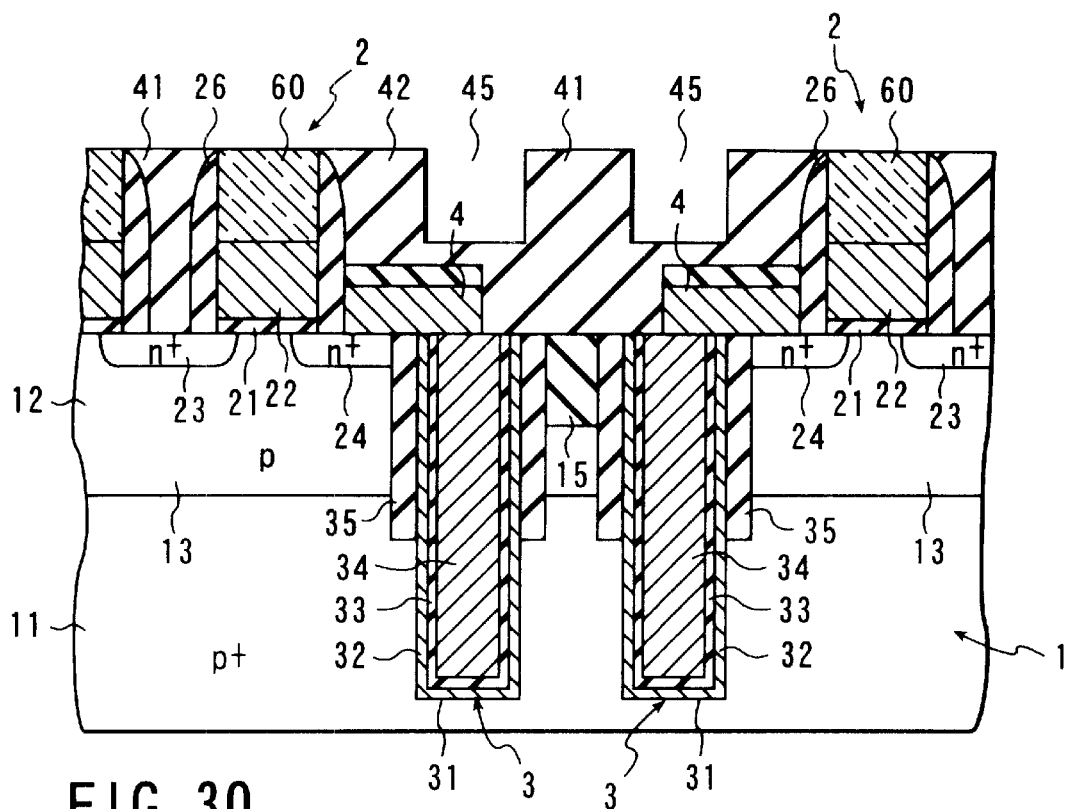
FIG. 30 is a cross-sectional view for illustrating the step of forming the grooves for provision of the word lines in the DRAM according to the second embodiment.
Figure 31:
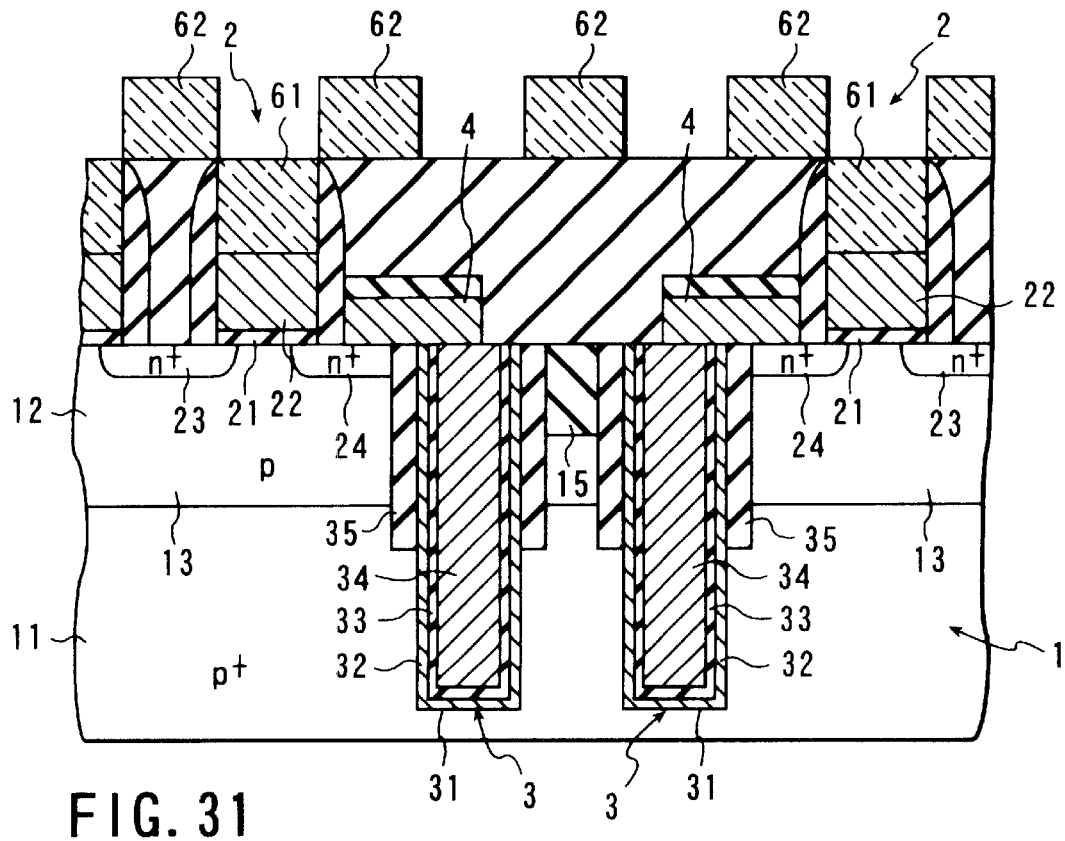
FIG. 31 is a cross-sectional view for illustrating a step of forming grooves for provision of word lines in a DRAM according to the third embodiment of the present invention.

FIG. 31 is a cross-sectional view for showing a manufacturing step included in the manufacturing method according to the third embodiment of the present invention, wherein the step of forming the grooves 45 according to the second embodiment is modified. In the second embodiment, the grooves 45 are formed after the silicon nitride films 25 on the gate electrodes 22 are eliminated as shown in FIGS. 28 to 30. On the other hand, in the third embodiment, first resists 61 are filled in the regions provided on the gate electrodes as shown in FIG. 31, after the silicon nitride films 25 on the gate electrodes 22 are eliminated. Then, in the lithography step, second resists 62 for use in forming the grooves 45 are formed due to patterning.

To be more specific, in the lithography step for forming the grooves 45, the focus margin can be increased since the film used as a base film for the lithography step is flattened.

In the third embodiment, as explained above, the above resist pattern constituted by the first and second resists 61 and 62 are formed at two steps. However, the resist pattern may be formed at one step, i.e. the lithography step.

Figure 32:
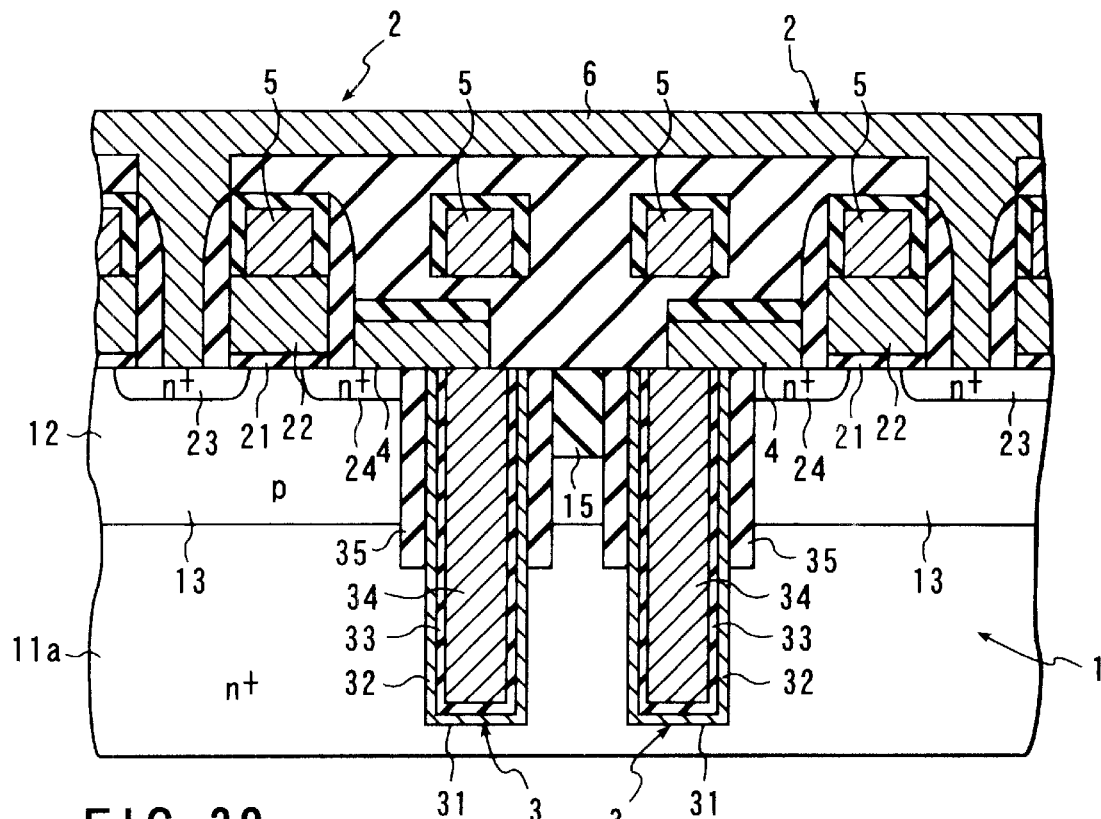
FIG. 32 is a cross-sectional view for illustrating a memory cell structure of a DRAM according to the fourth embodiment of the present invention, in contradistinction to FIG. 4.

FIG. 32 is a cross-sectional view for showing a manufacturing step included in the manufacturing method according to the fourth embodiment of the present invention, and corresponds to FIG. 4.

According to the first to third embodiments, the p$^+$-type silicon substrate 11 is used as the starting substrate. In contrast, in the fourth embodiment, an n$^+$-type silicon substrate 11a is used as the starting substrate. The plate electrodes 32 of the capacitors 3 are provided to ohmic-contact the n$^+$-type silicon substrate 11a. The other portions are the same in structure as those of the first to third embodiments.

In the first to third embodiment using the p$^+$-type silicon substrate 1, it is impossible to set a plate potential separate from the potential of the p-type well. In general, a negative bias is applied to the p-type well 12 in order that the cutoff characteristics of the NMOS transistor be optimized. Thus, the plate potential of the capacitor 3 is also negatively biased.

On the other hand, in the fourth embodiment, the potential of the plate electrode 32 of each capacitor 3 can be set at a value differing from that of the p-type well 12. Therefore, for example, it can be set such that the voltage applied to the capacitor insulating film 33 is minimized, thus improving the reliability thereof.

Figure 33:
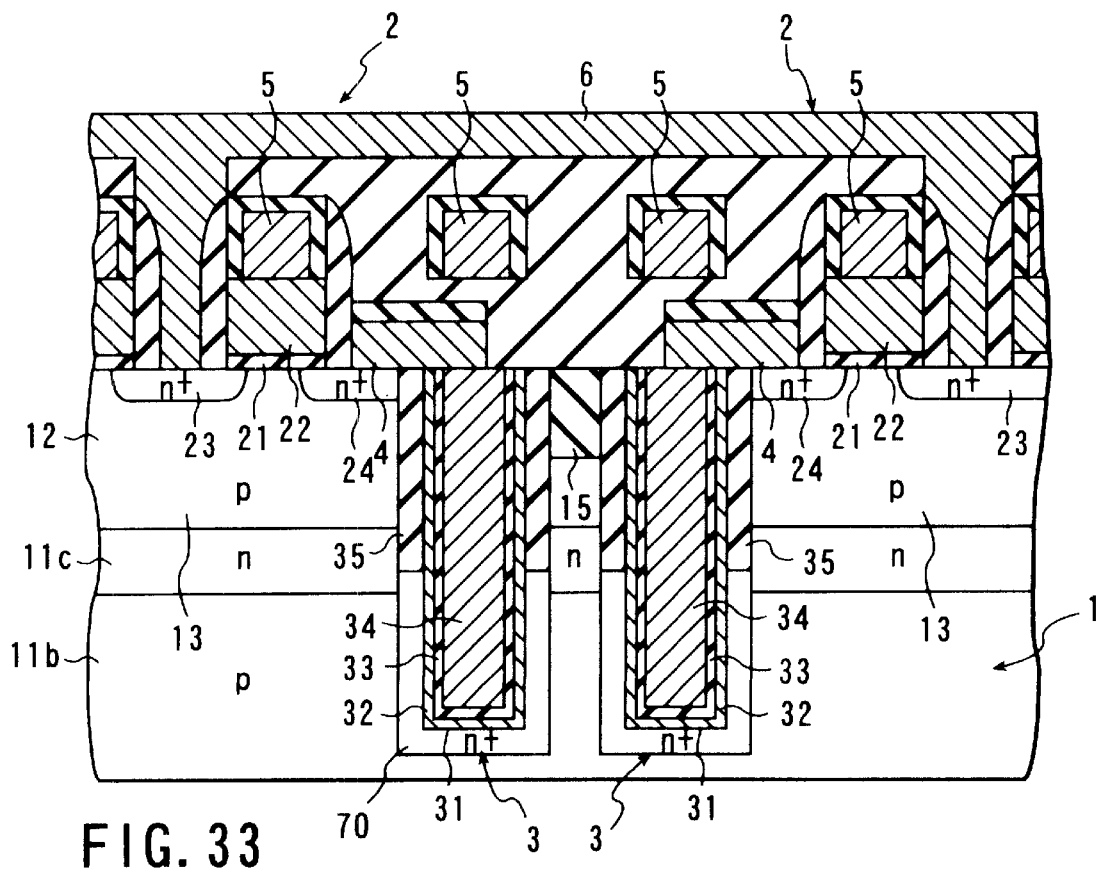
FIG. 33 is a cross-sectional view for illustrating a memory cell structure of a DRAM according to the fifth embodiment of the present invention, in contradistinction to FIG. 4.

FIG. 33 is a cross-sectional view for showing a cell structure according to the fifth embodiment of the present invention, in contradistinction to FIG. 4. In the fifth embodiment, a p-type silicon substrate 11b is used as the starting substrate. An n-type well 11c (or an n-type epitaxial layer) is formed on the p-type silicon substrate 11b, and a p-type well 12 is formed in the n-type well 11c. N$^+$-type diffusion layers 70 are formed on those lower portions of the outer peripheral surfaces of the capacitor grooves 31 which are not covered by the insulating films 35. They are connected to the n-type well 11c, and their potentials can be set at values differing from that of the p-type well 12.

As explained above, according to the present invention, the gate electrodes of the MOS transistors included in the memory cells are provided above the island-shaped element regions, and their widths are substantially equal to those of the element regions. To be more specific, the gate electrode material films are formed on the semiconductor substrate, with the gate insulating films interposed between the gate electrode material films and the semiconductor substrate, and the element isolation grooves are formed in the semiconductor substrate in such a manner as to pierce the gate electrode material films. By virtue of this feature, the gate electrodes can be formed to be self-aligned with the element regions. The gate electrodes are arranged in rows, and the gate electrodes of each of the rows are connected to each other by an associated one of the word lines.

Therefore, the floating capacitances of the word lines are small, and the DRAM achieves a high function, as compared with the conventional DRAM wherein the gate electrodes are included in the word lines.

Furthermore, in the present invention, the capacitor insulating films can be formed of the ferroelectric films. This is because a step of forming trench capacitors is carried out after formation of the MOS transistors. To be more specific, formation of the source and drain diffusion layers needs the high temperature heating step for activation of impurities. However, the characteristics of the ferroelectric films which are weak against heat are not degraded, since the step of forming the capacitor insulating films of the ferroelectric films is carried out after the heating step. In addition, use of the high dielectric constant material films as the capacitor insulating films ensures a great storage capacitance in a small area.

In particular, the resultant capacitors have the following advantages: they have great storage capacitances; they do not generate leakage current; and they have high reliability. This is because they are formed to comprise capacitor insulating films containing strontium ruthenium oxides, capacitor insulating films formed of barium strontium titanium oxides formed on the surfaces of the plate electrodes, and storage electrodes formed of strontium ruthenium oxides filled in the capacitor grooves.

Furthermore, in the present invention, the aforementioned contact portion of each of the bit lines is self-aligned between associated adjacent two of the word lines, with two insulating films interposed between the contact portion of each bit line and each of the associated adjacent two of the word lines. Thereby, in the small region between the associated two word lines, each bit line can be reliably provided to contact one of the source and drain diffusion layers, and at the same time each bit line and the associated two word lines can be reliably prevented from short-circuiting. By virtue of this feature, the DRAM can be formed at a higher integration density.

Moreover, in the present invention, the word lines are arranged to be located above the capacitors, and the connection conductors which connect the capacitors and the KOS transistors are located below the word lines and connected to the storage electrodes. Accordingly, the contact areas between the connection conductors and the storage electrodes such that the contact areas can be provided to be large, regardless of the pitch at which the word lines are arranged. In other words, the great contact areas are ensured even if the word lines are arranged at a shorter pitch.

As explained above, in the present invention, the gate electrodes are provided only above the element regions isolated from each other, and the word lines are formed of conductive layers differing from the layers constituted by the gate electrodes. Thus, the DRAM can be provided with a trench capacitor structure which the floating capacitances of the word lines are small, and thus it can operate at a higher speed.

In addition, the step of forming the MOS transistors is carried out before the step of forming the trench capacitors, thus enabling the high dielectric constant material films such as BSTO to be used as the capacitor insulating films. Thus, the DRAM can have an advantageous trench capacitor structure wherein a great storage capacitance is ensured in a small region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dynamic type semiconductor memory device comprising;
    a semiconductor substrate;
    element regions formed on the semiconductor substrate such that the element regions are island-shaped and isolated form each other by element isolation regions which comprise element isolation grooves and isolation insulating films filled in the element isolation grooves;
    MOS transistors including gate electrodes and source and drain diffusion layers, and arranged in rows in a first direction and also arranged in rows in a second direction perpendicular to the first direction, the gate electrodes being located above the element regions, the source and drain diffusion layers self-aligned with the gate electrodes;
    capacitor grooves formed in the semiconductor substrate and located at end portions of the element regions;
    capacitors including capacitor insulating films and storage electrodes, the capacitor insulating film being formed on inner walls of the capacitor grooves, the storage electrodes being formed within the capacitor grooves;
    connection conductors each connecting the storage electrode of a respective one of the capacitors and one of the source and drain diffusion layers of a respective one of the MOS transistors;
    word lines arranged such that each of the word lines connect the gate electrodes of those of MOS transistors which are arranged in an associated one of the rows in the first direction; and
    bit lines arranged such that each of the bit lines connects the others of the source and drain diffusion layers of those of the MOS transistors which are arranged in an associated one of the rows in the second direction, wherein the gate electrodes of the MOS transistors are self-aligned with inside edges of said element isolation grooves in the first direction.

2. The dynamic type semiconductor memory device according to claim 1, wherein the word lines are formed of conductive films constituting layers differing from layers constituted by the gate electrodes.

3. The dynamic type semiconductor memory device according to claim 1, wherein the word lines are formed of conductive films constituting layers located above layers constituted by the gate electrodes.

4. The dynamic type semiconductor memory device according to claim 1, wherein the gate electrodes of the MOS transistors have substantially the same widths as the element regions.

5. The dynamic type semiconductor memory device according to claim 1, wherein:
    the capacitors further include plate electrodes formed on the inner walls of the capacitor grooves and containing strontium ruthenium oxides;
    the capacitor insulating films are formed of barium strontium titanium oxide, and provided on surfaces of the plate electrodes; and
    the storage electrodes are formed of strontium ruthenium oxides, and provided on the capacitor insulating films, filling the capacitor grooves.

6. The dynamic type semiconductor memory device according to claim 1, wherein said each bit line has a connection portion which connects said others of said source and drain diffusion layers which are arranged in said associated one of the rows in the second direction, and which is self-aligned between associated adjacent two of the word lines, with two insulating films interposed between the contact portion of said each bit line and each of said associated two of the word lines.

7. The dynamic type semiconductor memory device according to claim 6, wherein the two insulating films consist of a first insulating film and a second insulating film, the first insulating film being formed on side walls of said associated adjacent two of the word lines, the second insulating film being formed on side walls of associated adjacent two of the gate electrodes and the side walls of associated adjacent two of the word lines, with the first insulating film interposed between the second insulating film and the side walls of said associated adjacent two of the word lines.

8. The dynamic type semiconductor memory device according to claim 1, wherein the word lines extend over the capacitors, and said each of the connection conductors is connected to said respective one of the storage electrodes under an associated one of the word lines.

9. A dynamic type semiconductor memory device comprising;
    a semiconductor substrate;
    element regions formed on the semiconductor substrate such that the element regions are island-shaped and isolated from each other by element isolation regions which comprise element isolation grooves and isolation insulating films filled in the element isolation grooves;
    MOS transistors including gate electrodes and source and drain diffusion lays, and arranged in rows in a first direction and also arranged in rows in a second direction perpendicular to the first direction, the gate electrodes being located above the element regions, the source and drain diffusion layers self-aligned with the gate electrodes;
    capacitor grooves formed in the semiconductor substrate and located at end portions of the element regions;

capacitor including capacitor insulating films and storage electrodes, the capacitor instating film being formed on inner walls of the capacitor grooves, the storage electrodes being formed within the capacitor grooves;

connection conductors each connecting the storage electrode of a respective one of the capacitors and one of the source and drain diffusion layers of a respective one of the MOS transistors;

word lines arranged such that each of the word lines connect the gate electrodes of those of MOS transistors which are arranged in an associated one of the rows in the first direction; and bit lines arranged such that each of the bit lines connects the others of the source and drain diffusion layers of those of the MOS transistors which are arranged in an associated one of the rows in the second direction, wherein the gate electrodes of the MOS transistors are self-aligned with the element isolation grooves in the first direction and the gate electrodes do not overlap the isolation insulating films.

10. A dynamic type semiconductor memory device, comprising:

a semiconductor substrate;

element regions forced on said semiconductor substrate such that said element regions are island-shape and isolated from each other by element isolation regions which comprises element isolation grooves and isolation insulting films filled in the element isolation grooves;

MOS transistors including gate electrodes and source and drain diffusion layers, and arranged in rows in a first direction and also arranged in rows in a second direction perpendicular to said first direction, said gate electrodes being located above said element regions, said source and drain diffusion layers self-aligned with said gate electrodes, said gate electrodes of said MOS transistors are self-aligned with inside edges of said element isolation grooves in said first direction;

capacitors including capacitor insulating films and storage electrodes;

connection conductors each connecting said storage electrode of a respective one of said capacitors and one of said source and drain diffusion layers of a respective one of said MOS transistors;

word lines arranged such that each of said word lines connects said gate electrodes of those of MOS transistors which are arranged in an associated one of said rows in said first direction; and bit lines arranged such that each of said bit lines connects said other of said source and drain diffusion layers of those of said MOS transistors which are arranged in an associated one of said rows in said second direction.

11. The dynamic type semiconductor memory device, according to claim 10, wherein said word lines are formed of conductive films constituting layers differing from layers constituted by said gate electrodes.

12. The dynamic type semiconductor memory device, according to claim 10, wherein said word lines are formed of conductive films constituting layers located above layers constituted by said gate electrodes.

13. The dynamic type semiconductor memory device, according to claim 10, wherein said gate electrodes of said MOS transistors have substantially same widths as said element regions.

14. The dynamic type semiconductor memory device, according to claim 10, wherein said each bit lines has a connection portion which connects said others of said source and drain diffusion layers which are arranged in said associated one of said rows in said second direction, and which is self-aligned between associated adjacent two of said word lines, with two insulating films interposed between said contact portion of said each bit line and each of said associated two of said word lines.

15. The dynamic type semiconductor memory device, according to claim 14, wherein said two insulating films comprises a first insulating film and a second insulating film, said first insulating film being formed on side walls of said associated adjacent two of said word lines, said second insulating film being formed on side walls of associated adjacent two of said gate electrodes and said side walls of associated adjacent two of said word lines, with said first insulating film interposed between said second insulating film and said side walls of said associated adjacent two of said word lines.

16. The dynamic type semiconductor memory device, according to claim 10, wherein said word lines extend over said capacitors, and said each of said connection conductors is connected to said respective one of said storage electrodes under an associated one of said word lines.

* * * * *